United States Patent [19]
Signell et al.

[11] Patent Number: 6,028,546
[45] Date of Patent: *Feb. 22, 2000

[54] PIPELINE ANALOG-TO-DIGITAL CONVERSION THAT REDUCES THE ACCUMULATION OFFSET ERRORS

[75] Inventors: Svante Signell, Vällingby; Bengt Erik Jonsson, Farsta; Helge Stenström; Nianxiong Tan, both of Stockholm, all of Sweden

[73] Assignee: Telefonaktiebolaget LM Ericsson, Stockholm, Sweden

[*] Notice: This patent is subject to a terminal disclaimer.

[21] Appl. No.: 08/990,334

[22] Filed: Dec. 15, 1997

[30] Foreign Application Priority Data

Dec. 16, 1996 [SE] Sweden ................................. 9604616

[51] Int. Cl.$^7$ ....................................................... H03M 1/38
[52] U.S. Cl. .......................................... 341/161; 341/155
[58] Field of Search .................................. 341/161, 155, 341/118, 120, 158, 159

[56] References Cited

U.S. PATENT DOCUMENTS

| | | |
|---|---|---|
| 3,035,258 | 5/1962 | Chasek . |
| 3,187,325 | 6/1965 | Waldhauer . |
| 4,599,602 | 7/1986 | Matzuzawa et al. . |
| 4,691,190 | 9/1987 | Robinson .................................. 341/97 |
| 4,745,394 | 5/1988 | Cornett .................................... 341/118 |
| 4,931,797 | 6/1990 | Kagawa et al. . |
| 5,283,583 | 2/1994 | Ichihara .................................. 341/162 |
| 5,550,492 | 8/1996 | Murden . |

OTHER PUBLICATIONS van de Plassche, R.J. et al., "A High–Speed 7 Bit Converter" IEEE Journal of Solid–State Circuits, vol. SC–14, No. 6, Dec. 1979.

*Primary Examiner*—Howard L. Williams
*Assistant Examiner*—Peguy JeanPierre
*Attorney, Agent, or Firm*—Burns, Doane, Swecker & Mathis, L.L.P.

[57] ABSTRACT

Pipeline A/D-conversion of an analog input signal is performed according to a new and inventive algorithm which generates a Gray coded digital output signal. A pipeline A/D-converter comprises a number of cascaded stages through which the analog input signal is propagated. Each stage generally generates an output bit of the digital output signal, and furthermore processes the pipeline signal. According to the inventive Gray coding algorithm, the output bit generated in a stage determines whether or not the pipeline signal of that stage is inverted. In a pipeline A/D-converter based on the Gray coding algorithm according to the invention, the accumulation of offset errors will generally be very low. Furthermore, the fact that the signal inversion is digitally controlled enables high precision implementations which further improve the performance of the inventive pipeline A/D-converter. In another embodiment of the invention, the Gray coding algorithm is modified to form a second algorithm which makes low device count implementations possible.

11 Claims, 10 Drawing Sheets

PIPELINE ANALOG-TO-DIGITAL CONVERSION THAT REDUCES THE ACCUMULATION OFFSET ERRORS

TECHNICAL FIELD

The present invention generally relates to analog-to-digital conversion, and more specifically to pipeline analog-to-digital conversion.

BACKGROUND

An analog-to-digital (A/D) converter is a circuit on the borderline between the analog domain and the digital domain which acts as an intermediary in the exchange of information between the two domains. As the name indicates, an A/D-converter converts or transforms analog input signals to digital output signals. An A/D-converter could be used for converting analog information such as audio signals or measurements of physical variables into numbers consisting of two-level digits or bits; a form suitable for digital processing. A/D-converters are found in numerous applications of all modern technologies. They are widely used in different fields of electronics and communication.

Many systems that use A/D-converters, such as powerful digital processing systems, demand high performance A/D-converters. Such high performance A/D-converters should be able to operate at high speed and with high accuracy.

A particular type of A/D-converter that operates at high speed is the pipeline A/D-converter. A pipeline A/D-converter is a discrete-time A/D-converter which comprises a number of fast and usually relatively simple bit generating and signal processing stages that are connected in cascade. In a 1-bit per stage architecture, each stage generates a single output bit.

However, conventional pipeline A/D-converters generally suffer from limited accuracy. It is known that offset errors due to imperfections in the circuit realizations severely influence the accuracy of conventional pipeline A/D-converters. In particular, pipeline A/D-converters of switched-capacitor type suffer from offset errors due to e.g. DC-offsets, low-frequency noise and clock induced charge injections. In pipeline A/D-converters which generate output signals of regular binary code, the offset errors propagate from stage to stage and accumulate in a strictly increasing manner during an A/D-conversion, thus limiting the accuracy of the converter and increasing the distortion. Relatively large differential and integral non-linearities will be introduced, and in the worst case scenario output codes might be missing.

SUMMARY

It is a general object of the present invention to provide a pipeline A/D-converter which substantially reduces the accumulation of errors during a conversion, compared to conventional pipeline A/D-converters.

It is another object of the invention to provide a pipeline A/D-converter which has high accuracy and low sensitivity to circuit realization imperfections.

A further object of the invention is to provide a method for pipeline A/D-conversion which mitigates the effect of offset errors on the A/D-conversion.

Yet another object of the invention is to provide a pipeline A/D-converter having high accuracy while maintaining a low device count.

These objects are solved by the invention as defined in the accompanying claims.

In accordance with a general inventive concept, pipeline A/D-conversion is performed according to an inventive algorithm which generates a Gray coded digital output signal. A pipeline A/D-converter comprises a number of cascaded stages through which the analog input signal is pipelined. The pipeline A/D-converter generates the output bits of the digital output signal in a discrete-time sequence. According to the inventive Gray coding algorithm, the output bit generated in a stage determines whether or not the pipeline signal of that stage is inverted. In a pipeline A/D-converter based on the Gray coding algorithm according to the invention, the accumulation of offset errors will generally be very low.

Furthermore, the fact that the signal inversion is digitally controlled enables high precision implementations which further improve the performance of the inventive pipeline A/D-converter.

In addition, by modifying the Gray coding algorithm according to the invention, a low device count implementation is made possible.

The pipeline A/D-conversion according to the invention offers the following advantages:

high accuracy and low distortion;
low accumulation of offset errors;
low sensitivity to circuit imperfections;
small differential and integral non-linearities;
few missing codes; and
good dynamic performance, especially for small input signals.

Other advantages offered by the present invention will be appreciated upon reading of the below description of the embodiments of the invention.

BRIEF DESCRIPTION OF THE DRAWINGS

The novel features believed characteristic of the invention are set forth in the appended claims. The invention itself, however, as well as other features and advantages thereof will be best understood by reference to the detailed description of the specific embodiments which follows, when read in conjunction with the accompanying drawings, wherein:

DETAILED DESCRIPTION

Figure 1:
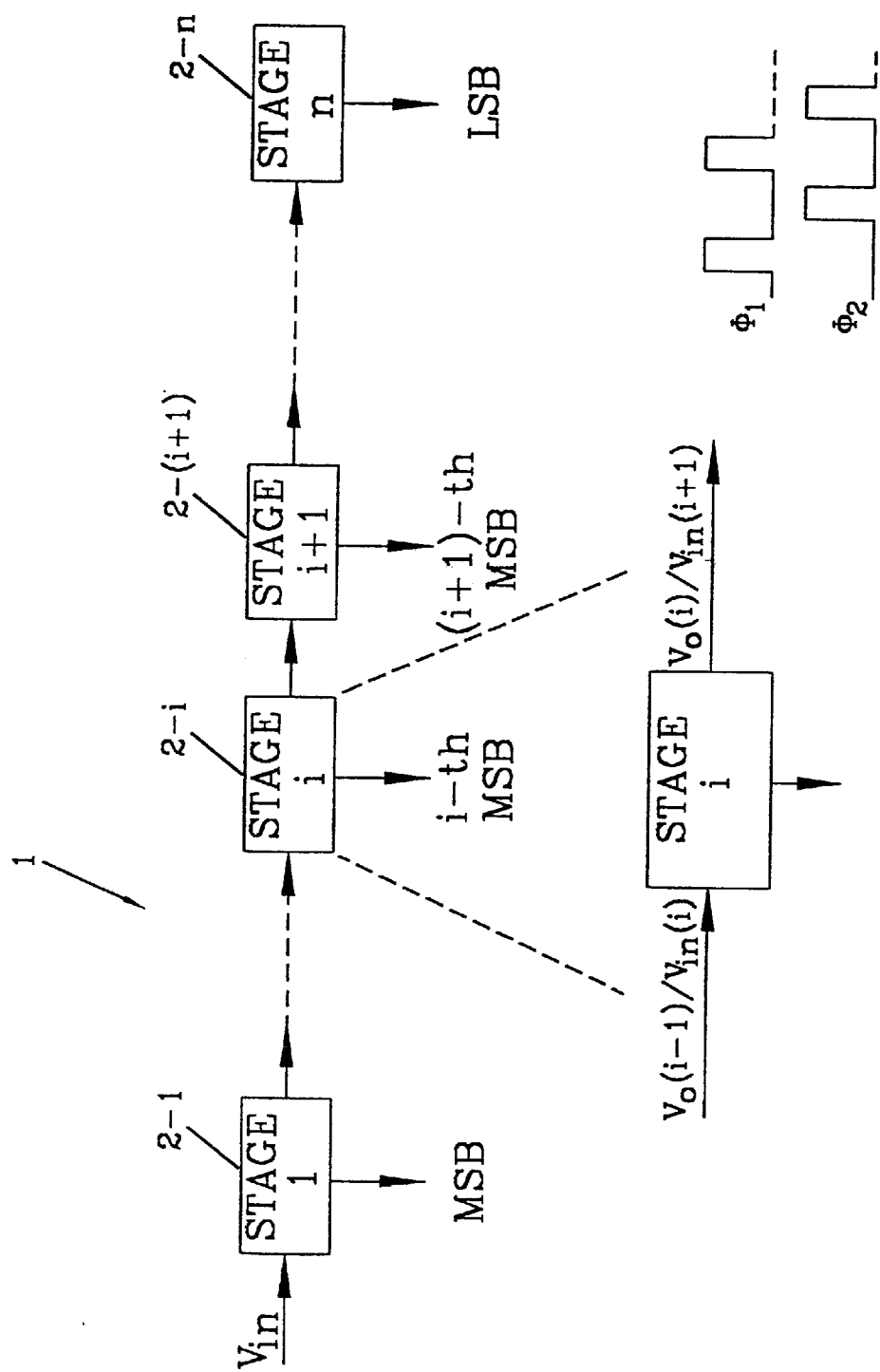
FIG. 1 is a schematic diagram illustrating the general structure of a pipeline A/D-converter.

With the intention of briefly explaining the general principle of a pipeline A/D-converter, reference will now be made to FIG. 1. FIG. 1 is a schematic diagram illustrating the general structure of a pipeline A/D-converter. The pipeline A/D-converter 1 comprises a number, n, of similar bit generating/signal processing stages 2-1 to 2-n, which are connected in cascade (in series). For illustrative purposes, all stages are not explicitly shown- In addition, for reasons of simplicity, a 1-bit per stage architecture is illustrated. Each one of the stages, except for the last stage, has an analog input terminal, an analog output terminal and a digital output terminal. The analog output terminal of a stage is connected to the analog input terminal of the following stage. The last stage, i.e. stage 2-n, has an analog input terminal and a digital output terminal. The stages 2-1 to 2-n are typically controlled by non-overlapping clock signals $\Phi_1$ and $\Phi_2$ in combination with some sort of sample-and-hold circuitry provided in the stages. This gives the pipeline A/D-converter 1 a discrete-time operation. If, by way of example, the i-th stage samples on clock phase $\Phi_1$, the (i−1)-th stage and the (i+1)-th stage sample on clock phase $\Phi_2$. The pipeline A/D-conversion starts when the first stage 2-1 receives and samples the analog input signal $V_{in}$ that is to be converted into a digital output signal. The first stage 2-1 generates the most significant bit (MSB) of the digital output in response to the analog input signal and further generates a first analog residue signal. The next stage generates the next output bit, the 2-nd MSB, in response to the first residue signal from the first stage 2-1, and further generates a second residue signal. The procedure continues until stage n is reached and the n-th output bit, the LSB, is generated. By definition, when all output bits of the digital output signal have been generated, the pipeline A/D-conversion is completed. In general, each stage 2-i samples a residue signal $V_o(i−1)$ from the preceding stage. The residue signal $V_o(i−1)$ from the preceding stage is also defined as a local input signal $V_{in}(i)$ to the current stage. The i-th MSB is generated in response to this local input signal $V_{in}(i)$. Furthermore, the local input signal $V_{in}(i)$ is processed in the stage to generate a new residue signal $V_o(i)$, which is the output signal of the stage 2-i. Naturally, this output residue signal $V_o(i)$ will act as a local input signal $V_{in}(i+1)$ to the next stage.

In order to fully utilize the high-speed capacity of a pipeline A/D-converter, the converter normally performs a number of A/D-conversions "simultaneously". In general, the first stage 2-1 generates the MSB, $b_1$-code1, of a first digital code value in response to a first sample of the analog input signal and further generates a residue signal which is passed to the second stage 2-2. The second stage 2-2 generates the 2-nd MSB, $b_2$-code1, of the first code value in response to the residue signal from the first stage 2-1, and generates a residue signal which is passed to the third stage 2-3. The third stage 2-3 generates the 3-rd MSB, $b_3$-code1, of the first code value in response thereto. At the same time the MSB, $b_1$-code2, of a second digital code value is generated in the first stage 2-1 by processing a second sample of the analog input signal. The first stage 2-1 and the third stage 2-3 both sample on the same clock phase. In this way, the pipeline A/D-converter may simultaneously process a number of samples, in different stages of the converter. This increases the throughput of the pipeline A/D-converter and ensures high-speed performance.

For a better understanding of the invention it is useful to begin by explaining the principle and operation of a conventional pipeline A/D-converter which is based on regular binary coding.

Conventional Pipeline A/D-conversion Using Regular Binary Code

In order to avoid misconceptions, the following definition of regular binary code will be used throughout the disclosure. In regular binary code, numbers are expressed as linear combinations of powers of 2:

$$\text{Number} = \sum_{i=1}^{n} b_i \cdot 2^{n-1},$$

where i and n are integers, and $b_i$ represents a two-level digit (the i-th bit). The integer n indicates the number of bits, and index i indicates the bit position. A coded number is normally represented as a sequence of bits, where the leftmost bit of the sequence is the most significant bit (MSB), and the rightmost bit is the least significant bit (LSB). Hereinafter, regular binary code will simply be referred to as binary code.

Figure 2:
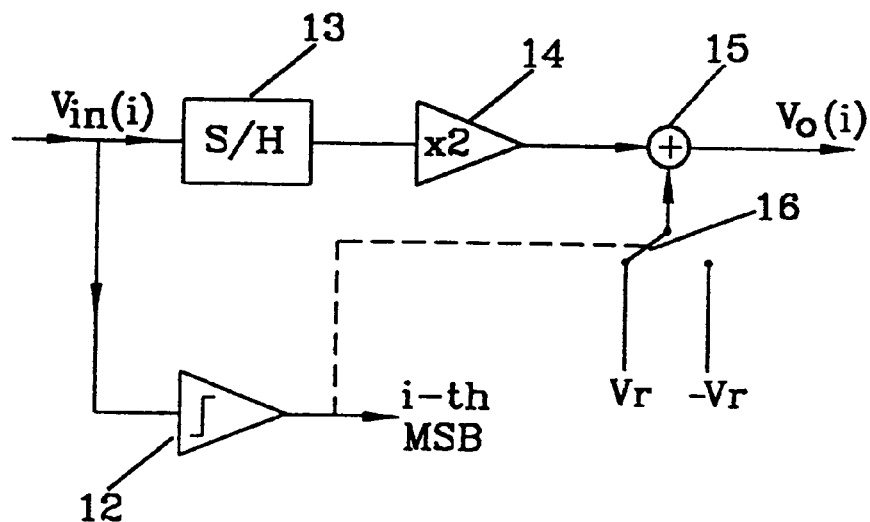
FIG. 2 is a schematic diagram illustrating a single stage of a conventional binary code pipeline A/D-converter (prior art)

FIG. 2 is a schematic diagram illustrating a single stage of a conventional pipeline A/D-converter which is based on binary code. The binary code pipeline stage shown in FIG. 2 comprises the following functional blocks: a comparator 12, a sample/hold circuit 13, an amplifier 14, an adder/subtractor 15, and a switch 16.

The stage of FIG. 2 operates as follows. The input signal $V_{in}(i)$ to the i-th stage is passed to the comparator 12 which generates the i-th output bit $b_i$ (i-th MSB) of the digital output signal depending on the sign of the input signal $V_{in}(i)$. The input signal $V_{in}(i)$ is also sampled by the sample/hold circuit 13. The sampled and held signal is amplified by a factor of 2 in the amplifier 14. The generated binary output bit, in this case $b_i$, determines whether a reference voltage $V_r$, hereinafter referred to as the reference signal, is added to or subtracted from the output signal of the amplifier 14. The generated binary bit $b_i$ controls a switch 16 such that either the reference signal or its inverse will be switched into connection with the adder/subtractor 15 and added to the output signal of the amplifier 14. The output signal of the adder/subtractor 15 is the residue output signal $V_o(i)$ of the stage. In the next clock phase, this residue output signal $V_o(i)$ will act as a local input signal $V_{in}(i+1)$ to the following stage.

To realize an n-bit binary code pipeline A/D-converter, n stages, connected in cascade, are required if a 1-bit per stage design is considered. In general, non-overlapping clock signals such as $\Phi_1$ and $\Phi_2$ shown in FIG. 1 are utilized to control the operation of the binary code pipeline A/D-converter. These clock signals are generated by a clock signal generator (not shown).

The operation of the conventional binary code pipeline A/D-converter can be summarized by an algorithm which is defined by the following equations:

$$V_{in}(i=1)=V_{in};\ V_o(i)=2\cdot V_{in}(i)+(-1)^{b_i}\cdot V_r, (1\leq i\leq n-1);\ V_{in}(i+1)=V_o(i) \quad (1.1)$$

and $$b_i = \begin{cases} 1, \text{ if } V_{in}(i) \geq 0 \\ 0, \text{ if } V_{in}(i) < 0 \end{cases} \quad (1 \leq i \leq n) \qquad (1.2)$$

where $b_i$ denotes the i-th binary output bit, and i is an integer value. Note that $b_1$ is the MSB and $b_n$ is the LSB of the digital output value. It should be understood that the analog input signal $V_{in}$ to be converted into digital form is defined as $V_{in}(i=1)$, and that the residue output signal $V_o(i)$ of the i-th stage acts as input signal $V_{in}(i+1)$ to the (i+1)-th stage. In the n-th stage, no residue output signal have to be generated, and therefore i ranges from 1 to n−1 in equation (1.1). This also means that the last stage, i.e. the n-th stage, only requires a comparator which generates the n-th output bit (LSB).

In order to more easily understand the operation of the conventional binary code pipeline A/D-converter, an illustrative example of an ideal binary code conversion of an analog input signal into a 4-bit digital output signal will be described with reference to equations (1.1) and (1.2). In order to generate a 4-bit signal, 4 stages are required in the pipeline A/D-converter.

In this particular example, assume that the reference voltage is equal to 1.0 V and that the input signal $V_{in}(i=1)$ corresponds to an input voltage of +0.49 V. The residue output signal of each stage will be generated according to equation (1.1), and the output bit will be generated according to equation (1.2). The A/D-conversion starts when the first stage receives and samples the analog input signal $V_{in}(i=1)$.

Generating the first binary bit b, (MSB) in the first stage, i=1:

$V_{in}(1) = 0.49 \rightarrow b_1 = 1,$ $V_o(1) = 2 \cdot 0.49 + (-1)^1 \cdot 1.0 = 0.98 - 1.0 = -0.02$ Generating the second binary bit $b_2$ (2-nd MSB) in the second stage, i=2:

$V_{in}(2) = V_o(1) \rightarrow b_2 = 0,$ $V_o(2) = 2 \cdot (-0.02) + (1)^0 \cdot 1.0 = -0.04 + 1.0 = 0.96$ Generating the third binary bit $b_3$ (3-rd MSB) in the third stage, i=3:

$V_{in}(3) = V_o(2) \rightarrow b_3 = 1,$ $V_o(3) = 2 \cdot 0.96 + (-1)^1 \cdot 1.0 = 1.92 - 1.0 = 0.92$ Generating the fourth binary bit $b_4$ (4-th MSB) in the fourth stage, i=4:

$V_{in}(4) = V_o(3) \rightarrow b_4 = 1.$

According to the example, the resulting digital output signal will have 4 bits, and hence the 4-th MSB is the LSB. By definition, when the LSB has been generated the A/D-conversion is completed. Accordingly, with a reference voltage of 1.0 V corresponding to the binary coded value of 1111, an input voltage of +0.49 V was converted into the binary coded output signal 1011.

However, conventional pipeline A/D-converters using binary coding suffer from high sensitivity to offset errors caused by circuit realization imperfections. In practical switched-capacitor realizations, offset errors generally originate from clock induced charge injections in the clock controlled switches of the A/D-converter, and DC-offsets. Of course other types of errors such as low-frequency noise may be produced in the conversion. Anyway, in each stage, or more particularly in the i-th stage, an offset error $\Delta V_e(i)$ will be generated. In a pipeline A/D-converter, the pipeline signal goes from stage to stage, and the error in a particular stage is not necessarily identical to that of the other stages. It is however assumed that part of the error is correlated and that part is uncorrelated, such that $\Delta V_e(i) = \Delta V_s + \Delta V_r(i)$, where $\Delta V_s$ is a systematic error that is identical to all stages, and $\Delta V_r(i)$ is a random error that is individual for each stage. The random error $\Delta V_r(i)$ has an expectance value equal to zero. The systematic error $\Delta V_s$ may of course vary from A/D-converter to A/D-converter. The errors generated in a conversion will propagate from stage to stage and accumulate in the pipeline A/D-converter. Referring to equation (1.1) above with consideration to the error $\Delta V_e(i) = \Delta V_s + \Delta V_r(i)$ produced in each stage, the following equation results:

$$V_o(i) = 2 \cdot V_{in}(i) + (-1)^{b_i} \cdot V_r + \Delta V_s + \Delta V_r(i) \qquad (1.3)$$

Because of the structure of the conventional binary code pipeline A/D-converter, the systematic part of the errors will accumulate from stage to stage in a strictly increasing manner. This can be seen by iterating equation (1.3) from i=1 up until i=n−1, with the following result:

$$V_o(n-1) = 2^{n-1} \cdot V_{in} + \sum_{j=1}^{n-1} 2^{n-1-j} \cdot (-1)^{b_j} \cdot V_r + \qquad (1.4)$$

$$\sum_{j=1}^{n-1} 2^{n-1-j} \cdot \Delta V_s + \sum_{j=1}^{n-1} 2^{n-1-j} \cdot \Delta V_r(j)$$

In the n-th stage, no residue output is generated, and for reasons of simplicity comparator offsets are considered negligible. Consequently, no offset error is produced in generating the n-th output bit. Accordingly, the total accumulated error for an n-bit pipeline A/D-converter using binary coding, is given by:

$$\varepsilon_{bin} = \sum_{j=1}^{n-1} 2^{n-1-j} \Delta V_s + \sum_{j=1}^{n-1} 2^{n-1-j} \Delta V_r(j) \qquad (1.5)$$

where $\Delta V_s$ is the systematic offset error identical for all stages, and $\Delta V_r(j)$ represents the random error produced in the j-th stage. The systematic offset errors are truly accumulated, limiting the resolution and increasing the distortion of the conventional binary code pipeline A/D-converter.

Pipeline A/D-conversion According to the Invention

The general idea according to the present invention is to perform pipeline A/D-conversion of an analog input signal into a digital output signal according to an inventive Gray coding algorithm. Naturally, the generated digital output signal will be in the form of Gray code. In a first embodiment of the invention, a first Gray coding algorithm is utilized. According to a preferred embodiment of the invention, the first Gray coding algorithm is modified to form a second Gray coding algorithm. In a pipeline A/D-converter architecture based on either of the first and second algorithms, the accumulation of errors during a pipeline A/D-conversion will be very low. In particular, when compared to a conventional binary code pipeline A/D-converter, the error accumulation will be substantially reduced.

In general, Gray code is known as a sequence of bit patterns in which adjacent patterns differ in only a single bit. The Gray code structure is most easily understood by studying table I given below. Table I illustrates 4-bit Gray code to the left, 4-bit binary code in the middle and corresponding decimal numbers to the right.

TABLE I

| Gray | Binary | Decimal |
|------|--------|---------|
| 0000 | 0000 | 0 |
| 0001 | 0001 | 1 |
| 0011 | 0010 | 2 |
| 0010 | 0011 | 3 |
| 0110 | 0100 | 4 |
| 0111 | 0101 | 5 |
| 0101 | 0110 | 6 |
| 0100 | 0111 | 7 |
| 1100 | 1000 | 8 |
| 1101 | 1001 | 9 |
| 1111 | 1010 | 10 |
| 1110 | 1011 | 11 |
| 1010 | 1100 | 12 |
| 1011 | 1101 | 13 |
| 1001 | 1110 | 14 |
| 1000 | 1111 | 15 |

In both types of code, Gray code and binary code, the rightmost bit is the least significant bit. It should however be realized that in Gray code, no specific bit weights can be assigned to the bits of the coded values. Gray code is sometimes described as a reflection code, because all the positions of a Gray code value except for the leftmost bit position appear as a reflection around a reflection line, whereas the leftmost position changes logical state.

Because of the single bit change between adjacent bit patterns, Gray coding is often used for representing quantized signal levels and in phase shift keying.

Gray coding has also been used in connection with A/D-converters in the prior art:

According to the article "A High-Speed 7 Bit A/D Converter" in IEEE Journal of Solid-State Circuits, Vol. SC-14, No. 6, December 1979, by R. J. van de Plassche and R. E. J. van der Grift, Gray coding is used in folding-type A/D-converters. A folding-type A/D-converter comprises a plurality of parallel stages, and converts all bits in parallel, as opposed to a pipeline A/D-converter which uses a sequence of interconnected stages to sequentially generate the output signal bit by bit. Since a folding-type converter determines all bits in parallel, there is no error accumulation as in pipeline converters. Instead, in the folding-type A/D-converter, Gray coding is used for reducing the number of comparators in the circuit realization.

U.S. Pat. No. 3,187,325 issued to F. D. Waldhauer on Jun. 1, 1965, discloses a stage-by-stage encoder comprising a multiplicity of similar stages connected in cascade. The stage-by-stage encoder of Waldhauer generates Gray code words by using an all-analog continuous folding technique.

U.S. Pat. No. 3,035,258 issued to N. E. Chasek on May 15, 1962, discloses a pulse code modulation encoder generating Gray code words by means of an all-analog folding technique. The PCM-encoder has a plurality of cascaded encoder circuits. Each encoder circuit comprises a full wave rectifier, a sensing circuit for determining the instantaneous polarity of the signal and a sampling network for sampling the signal polarity at a suitable rate.

Figure 3:
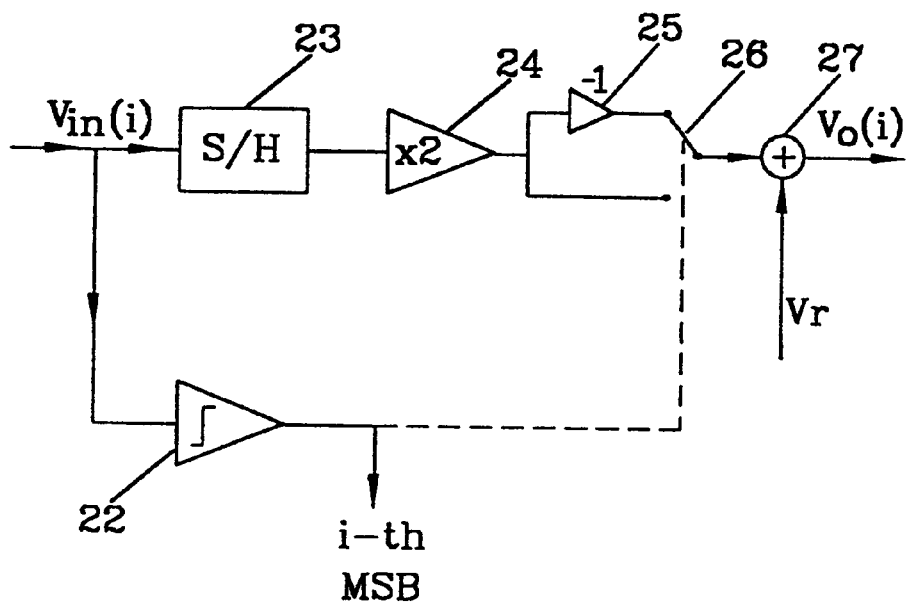
FIG. 3 is a schematic diagram illustrating a single stage of a pipeline A/D-converter according to the invention.

Now, the basic principle of the present invention will be explained with reference to FIG. 3 which schematically illustrates an example of a single stage of a pipeline A/D-converter according to the invention. The pipeline stage of FIG. 3 comprises the following functional blocks: a comparator 22, a sample/hold circuit 23, an amplifier 24, a inverter 25, a switch 26 and an adder 27.

The stage of FIG. 3 operates as follows. The input signal $V_{in}(i)$ to the i-th stage is passed from the preceding stage to the comparator 22 which generates the i-th bit $b_i$ (i-th MSB) of the digital output signal depending on the sign of the input signal $V_{in}(i)$. The generated output bit is in the form of Gray code. The input signal is also sampled by the sample/hold circuit 23. The sampled and held signal is amplified by a factor of 2 in the amplifier 24. The generated Gray code bit $b_i$ determines whether the output signal of the amplifier 24 or its inverse is added to a reference voltage Vr, hereinafter referred to as the reference signal. The reference signal is generated by a conventional signal source (not shown). The signal inversion is carried out by the inverter 25. The switch 26, which is controlled by the generated Gray code bit, determines if the output signal of the amplifier 24 or its inverse is connected to the adder 27. The output signal of the adder 27 is the residue output signal $V_o(i)$ of the stage. In the next clock phase, this residue output signal $V_o(i)$ will act as a local input signal $V_{in}(i+1)$ to the following stage.

To realize an n-bit pipeline A/D-converter according to the invention, n stages are required if a 1-bit per stage design is considered. The first n−1 stages are identical to each other, while the last stage only has a comparator for generating the n-th output bit. The stages are connected in cascade in accordance with the overall structure of a conventional pipeline A/D-converter as shown in FIG. 1. In general, non-overlapping clock signals are utilized to control the operation of the pipeline A/D-converter according to the invention. These clock signals are generated by a clock signal generator (not shown). Naturally, the A/D-conversion starts when the first stage receives and samples the analog input signal that is to be converted into digital form. The analog signal is processed and pipelined through the consecutive stages of the converter, successively generating the output bits one by one, until the n-th stage is reached and the last output bit is generated.

The operation of the pipeline A/D-converter according to the invention can be summarized by a first Gray coding algorithm which is defined by the following equations:

$$V_{in}(i=1)=V_{in}$$

$$V_o(i)=2\cdot(-1)^{b_i}\cdot V_{in}(i)+V_r (1\leq i\leq n-1); \quad V_{in}(i+1)=V_o(i) \qquad (2.1)$$

and $$b_i = \begin{cases} 1, & \text{if } V_{in}(i) \geq 0 \\ 0, & \text{if } V_{in}(i) < 0 \end{cases} \quad (1 \leq i \leq n) \qquad (2.2)$$

where i is an integer value and $b_i$ denotes the i-th output bit (in the form of Gray code). It should be understood that the analog input signal $V_{in}$ to be converted into digital form is defined as $V_{in}(i=1)$, and that the residue output signal $V_o(i)$ of the i-th stage acts as input signal $V_{in}(i+1)$ to the (i+1)-th stage. In the n-th stage, no residue output signal have to be generated, and therefore i ranges from 1 to n−1 in equation (2.1). The integer value n represents the number of bits of the digital output signal.

By studying the first algorithm according to the invention, as defined above in equations (2.1) and (2.2), it can be seen that the digital information obtained from the bit decision in a stage is utilized in generating the residue output signal of that stage. The bit decision of the following stage is based on this residue output signal. Accordingly, a decision feed-forward function is inherent in the algorithm. In practical implementations of the first Gray coding algorithm according to the invention, this feed-forward of earlier bit decisions normally requires some sort of sample-and-hold functionality. It is the hold operation of the sample-and-hold circuitry that enables the feed-forward of the generated digital information. This will be explained in more detail later, in connection with a fully differential realization of the invention.

Figure 4:
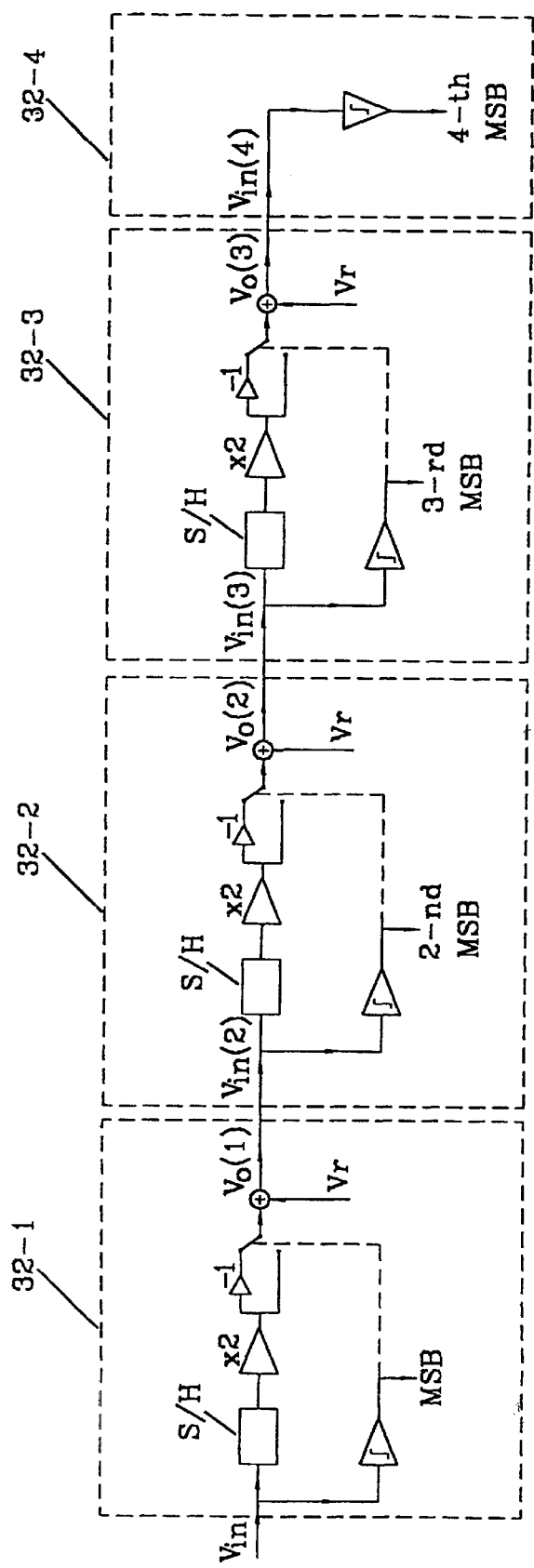
FIG. 4 is a schematic diagram illustrating an exemplary 4-bit Gray code pipeline A/D-converter according to the invention.

FIG. 4 is a schematic diagram of an illustrative 4-bit Gray code pipeline A/D-converter according to the invention. The 4-bit pipeline A/D-converter comprises four stages 32-1, 32-2, 32-3 and 32-4. The three first stages 32-1, 32-2 and 32-3 are identical to that of FIG. 3, while the last stage 32-4 only includes a comparator. The analog input signal $V_{in}$ is received and sampled by the first stage 32-1 which generates the first Gray code bit $b_1$, the MSB, of the first digital code value in response to a first sample of the input signal $V_{in}$. The first sample of the input signal $V_{in}$ is processed in the first stage 32-1 to generate a first residue output signal $V_o(11)$. This first residue output signal $V_o(1)$ is passed to the second stage 32-2 as $V_{in}(2)$. In the second stage 32-2, the second Gray code bit $b_2$, the 2-nd MSB, of the first code value is generated. The second stage 32-2 further generates a second residue output signal $V_o(2)$, which in turn is passed to the third stage 32-3 as $V_{in}(3)$. The third stage 32-3 generates the third Gray code bit $b_3$, the 3-rd MSB, of the first code value and generates a third residue output signal $V_o(3)$. The third residue output signal $V_o(3)$ is forwarded as $V_{in}(4)$ to the comparator of the last stage 32-4, thus generating the fourth Gray code bit $b_4$, the 4-th MSB, of the first code value.

If the high-speed capacity of the pipeline A/D-converter is to be utilized, a new sample of the input signal is taken care of by the first stage 32-1 at the same time as the third MSB of the first digital code value is generated in the third stage 32-3. The first stage 32-1 generates the MSB of a second digital code value in response to this new sample.

For a better understanding of the operation of the Gray code pipeline A/D-converter according to the invention, an illustrative example of an ideal conversion of an analog input signal into a 4-bit digital output signal will now be described with reference to FIG. 4 and equations (2.1) and (2.2). In order to be able to compare the conventional binary code conversion and the inventive Gray code conversion, consider the same reference voltage, 1.0 V, and the same input voltage, 0.49 V, as in the example with the binary code pipeline A/D-converter above. The residue output signal of each stage will be generated according to equation (2.1), and the i-th Gray code bit $b_i$ is generated according to equation (2.2).

Generating the first Gray code bit $b_1$ (MSB) in the first stage, i=1:

$V_{in}(1) = V_{in} = 0.49 \rightarrow b_1 = 1$, and $V_o(1) = 2 \cdot (-1)^1 \cdot 0.49 + 1.0 = -0.98 + 1.0 = 0.02$.

Generating the second Gray code bit $b_2$ (2-nd MSB) in the second stage, i=2:

$V_{in}(2) = V_o(1) \rightarrow b_2 = 1$, and $V_o(2) = 2 \cdot (-1)^1 \cdot 0.02 + 1.0 = -0.04 + 1.0 = 0.96$.

Generating the third Gray code bit $b_3$ (3-rd MSB) in the third stage, i=3:

$V_{in}(3) = V_o(2) \rightarrow b_3 = 1$, and $V_o(3) = 2 \cdot (-1)^1 \cdot 0.96 + 1.0 = -1.92 + 1.0 = -0.92$.

Generating the fourth Gray code bit $b_4$ (4-th MSB) in the fourth stage, i=4:

$V_{in}(4) = V_o(3) \rightarrow b_4 = 0$.

Since the resulting digital output value should have 4 bits in this particular example, the 4-th MSB is the LSB, and when the LSB has been generated the A/D-conversion is completed. Accordingly, with a reference voltage of 1.0 V corresponding to the Gray coded signal or value of 1000, an input voltage of +0.49 V was converted into the Gray coded output signal or value 1110. By using Table I above, it can be seen that the Gray coded value 1110 corresponds to the binary coded value 1011, which is the same binary coded value as that generated in the conventional binary code pipeline A/D-conversion of a +0.49 V input voltage above. Consequently, the resulting digital output signal of the Gray code converter and the resulting digital output value of the conventional binary code converter are consistent with each other, although they are generated in different types of code. However, the propagation of offset errors in the Gray code pipeline A/D-conversion according to the invention differs completely from that in conventional binary code pipeline A/D-conversion. In each stage of a Gray code pipeline A/D-converter according to the invention, an offset error $\Delta V_e(i)$ will normally be generated. In a switched capacitor realization, the main contribution to the offset in each stage is normally due to clock induced charge injections in the clock controlled switches and other DC-offsets. It is assumed that $\Delta V_e(i) = \Delta V_s + \Delta V_r(i)$, where $\Delta V_e$ is a systematic error that is identical to all stages, and $\Delta V_r(i)$ is a random error that is individual for each stage. The random error $\Delta V_r(i)$ has an expectance value equal to zero. The systematic error $\Delta V_s$ may of course vary from A/D-converter to A/D-converter. Because of the structure of a pipeline A/D-converter based on the first Gray coding algorithm according to the invention, the systematic part of the offset errors will not necessarily accumulate in an increasing manner. Referring to equation (2.1) above with consideration to the error $\Delta V_e(i) = \Delta V_s + \Delta V_r(i)$ produced in the i-th stage, the following equation results:

$$V_o(i) = 2 \cdot (-1)^{b_i} \cdot V_{in}(i) + V_r + \Delta V_s + \Delta V_r(i) \qquad (2.3)$$

By iterating equation (2.3) from i=1 up until i=n−1, the result will be:

$$V_o(n-1) = \qquad (2.4)$$

$$2^{n-1} \cdot (-1)^{\sum_{j=1}^{n-1} b_j} \cdot V_{in} + \left\{ \sum_{j=1}^{n-2} \left( 2^{n-1-j} \cdot (-1)^{\sum_{k=j+1}^{n-1} b_k} \right) + 1 \right\} \cdot V_r +$$

-continued $$\left\{\sum_{j=1}^{n-2}\left(2^{n-1-j}\cdot(-1)^{\sum_{k=j+1}^{n-1}b_k}\right)+1\right\}\cdot\Delta V_s +$$

$$\sum_{j=1}^{n-2}\left(2^{n-1-j}\cdot(-1)^{\sum_{k=j+1}^{n-1}b_k}\cdot\Delta V_r(j)\right)+\Delta V_r(n-1)$$

In the n-th stage, no residue output is generated, and for reasons of simplicity comparator offsets are considered negligible. Consequently, no error is produced in generating the n-th output bit. Therefore, the total accumulated error for an n-bit pipeline A/D-converter based on the first Gray coding algorithm according to the invention, is given by:

$$\varepsilon_{Gray} = \left\{\sum_{j=1}^{n-2}\left(2^{n-1-j}\cdot(-1)^{\sum_{k=j+1}^{n-1}b_k}\right)+1\right\}\cdot\Delta V_s + \quad (2.5)$$

$$\sum_{j=1}^{n-2}\left(2^{n-1-j}\cdot(-1)^{\sum_{k=j+1}^{n-1}b_k}\cdot\Delta V_r(j)\right)+\Delta V_r(n-1)$$

where $\Delta V_s$ is the systematic offset error identical for all stages, and $\Delta V_r(j)$ represents the random error produced in the j-th stage.

Now, compare the total accumulated error for the binary code pipeline A/D-converter and the inventive Gray code pipeline A/D-converter by studying expression (1.5) and expression (2.5). The mean value and variance of the random error component for Gray code conversion according to the invention are identical to those for binary code conversion. In particular, the mean value of the random error component is equal to zero. Accordingly, for simplicity and clarity, the random errors will be disregarded in the remaining part of the disclosure.

Since $$(-1)^{\sum_{k=j+1}^{n-1}b_k} = \pm 1, \quad (3.1)$$

the following relation holds true:

$$2^{n-1-j}\cdot(-1)^{\sum_{k=j+1}^{n-1}b_k} \le 2^{n-1-j}. \quad (3.2)$$

Regarding the systematic offset errors, the following relation results:

$$|\varepsilon_{Gray}| = \left|\left\{\sum_{j=1}^{n-2}\left(2^{n-1-j}\cdot(-1)^{\sum_{k=j+1}^{n-1}b_k}\right)+1\right\}\cdot\Delta V_s\right| \le \quad (3.3)$$

$$\left|\left\{\sum_{j=1}^{n-2}(2^{n-1-j})+1\right\}\cdot\Delta V_s\right| = \left|\sum_{j=1}^{n-1}2^{n-1-j}\Delta V_s\right| = |\varepsilon_{bin}|$$

Strictly mathematically speaking, equation (3.3) shows that the total accumulated systematic error in an n-bit Gray code pipeline A/D-conversion according to the invention is smaller than or equal to the total accumulated systematic error in an n-bit binary code pipeline A/D-conversion. In practice, however, the Gray code accumulated systematic error will almost always be smaller than the binary code accumulated systematic error. It is useful to give a brief and intuitive explanation of this fact. As is well known, the systematic error $\Delta V_s$ produced in each stage will propagate through the remaining stages of the A/D-converter. However, in the pipeline A/D-converter based on the first Gray coding algorithm according to the invention, in each stage, the pipeline signal is selectively subjected to an inversion, depending on the Gray code bit generated in the stage. Since the generated Gray code bits vary between the discrete states 0 and 1 more or less randomly, depending on the particular application, the systematic errors associated with the pipeline stages will sometimes be added to and sometimes subtracted from the total systematic error accumulated up until that point. Consequently, the systematic offset errors generated during an A/D-conversion will not necessarily accumulate in an increasing manner, and the total accumulated systematic error will lie substantially closer to zero in a Gray code conversion according to the invention than in a conventional binary code conversion.

Accordingly, with regard to the sensitivity to circuit imperfections, the Gray code pipeline A/D-converter according to the invention has a significant advantage over its binary code counterpart.

For illustrative purposes, the error accumulation for an exemplary 4-bit binary coded value, 0110, generated conventionally, and the error accumulation for the corresponding 4-bit Gray coded value 0101, generated in accordance with the invention, will be compared in the following. Since a 4-bit value is considered in this particular example, n is equal to 4. The systematic offset error in generating each bit is assumed to be +0.02 V. For simplicity, as explained above, the random errors are assumed to be zero.

Binary Code Accumulated Error

According to equation (1.5) for a binary code pipeline A/D-converter, the total accumulated offset error in generating the binary coded value 0110 will be:

$$\varepsilon_{bin}(n=4)=2^2\cdot 0.02+2^1\cdot 0.02+2^0\cdot 0.02=0.08+0.04+0.02=0.14.$$

Gray Code Accumulated Error

According to equation (2.5) for a Gray code pipeline A/D-converter according to the invention, the total accumulated offset error in generating the Gray coded value 0101 ($b_1=0$, $b_2=1$, $b_3=0$, $b_4=1$) will be:

$$\varepsilon_{Gray}(n=4)=2^2\cdot(-1)^{(1+0)}\cdot 0.02+2^1\cdot(-1)^{(0)}\cdot 0.02+0.02==4\cdot(-1)\cdot 0.02+$$
$$2\cdot(1)\cdot 0.02+0.02=-0.08+0.04+0.02=-0.02.$$

It can be seen that $|\varepsilon_{Gray}|<|\varepsilon_{bin}|$. The Gray code error accumulation according to the invention is generally considerably lower than the binary code error accumulation. This is a property directly related to the term $(-1)^{b_i}$ associated with $V_{in}(i)$ in the first Gray coding algorithm defined above in equations (2.1) and (2.2). In a statistical sense, the total accumulated systematic error in a pipeline A/D-conversion according to the invention is reduced in the majority of cases.

Figure 5:
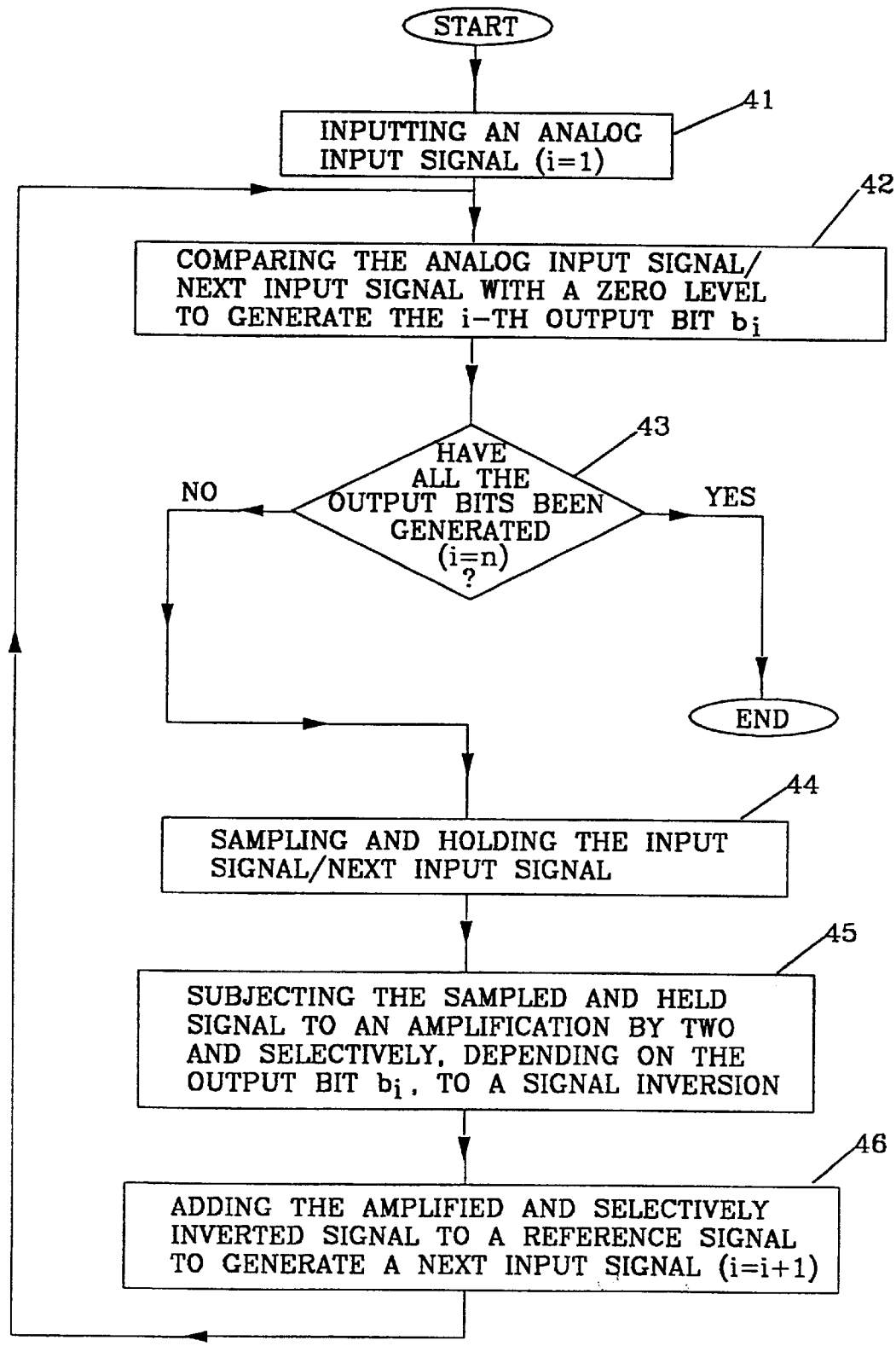
FIG. 5 is a schematic flow diagram of a method for pipeline conversion of an analog input signal into a digital output signal in accordance with a preferred embodiment of the invention.

FIG. 5 is a schematic flow diagram of a method for pipeline conversion of an analog input signal into a digital output signal according to a preferred embodiment of the invention. It is assumed that the resulting digital output signal has a predetermined number, n, of output bits $b_i$, where i is an integer ranging from 1 to n. The pipeline A/D-conversion based on the first Gray coding algorithm according to the invention basically works as follows. In step 41, the analog input signal $V_{in}(i=1)=V_{in}$ is inputted for A/D-conversion. At this point i is equal to 1, indicating that the first output bit is to be generated in the first stage. Next, in step 42, the analog input signal $V_{in}(i=1)$ is compared with a zero level to generate the first Gray code output bit $b_1$ in accordance with equation (2.2). If i is equal to n, i.e. if all the bits of the digital output signal have been generated (YES) at this point (step 43) the A/D-conversion is completed and the procedure ends. However, the digital output signal generally comprises more than a single bit (NO), and the procedure continues with step 44. In step 44, the input signal is sampled and held. Next, in step 45, the sampled and held signal is subjected to an amplification by two and selectively, depending on the Gray coded output bit $b_1$ previously generated in step 42, to a signal inversion. The amplified and selectively inverted signal is added to a predetermined reference signal in step 46, to generate a first residue output signal $V_o(i=1)$. This residue output signal $V_o(i=1)$ will act as a next input signal $V_{in}(i=i+1=2)$ in the generation of the next output bit $b_2$ in the following stage. Thus, the integer i is incremented by one. The procedure continues in step 42, in which the next input signal $V_{in}(2)$ is compared to a zero level to generate the second Gray code output bit $b_2$. The procedure continues in accordance with the flow diagram shown in FIG. 5 until all n output bits have been generated.

If the high-speed feature of the pipeline A/D-conversion is utilized, several samples of the input signal are simultaneously processed in different stages. A first sample of the input signal is pipelined and processed through the consecutive stages. As soon as the residue output signal of the first stage has been sampled by the next stage, the first stage is ready to receive a next sample of the input signal. Accordingly, in the next sampling clock phase of the first stage, the MSB of the next digital code value is generated by the first stage and the pipeline process is initiated for this new sample. This increases the throughput of the pipeline A/D-conversion.

It should be understood that the specific order of the amplification by two, and the selective signal inversion in step 45 generally is not critical for the pipeline A/D-conversion according to the invention. It is possible to selectively, in dependence on the generated output bit $b_i$, invert the sampled and held signal before amplifying it by two. This also holds true for the Gray code pipeline stage shown in FIG. 3.

Figure 6:
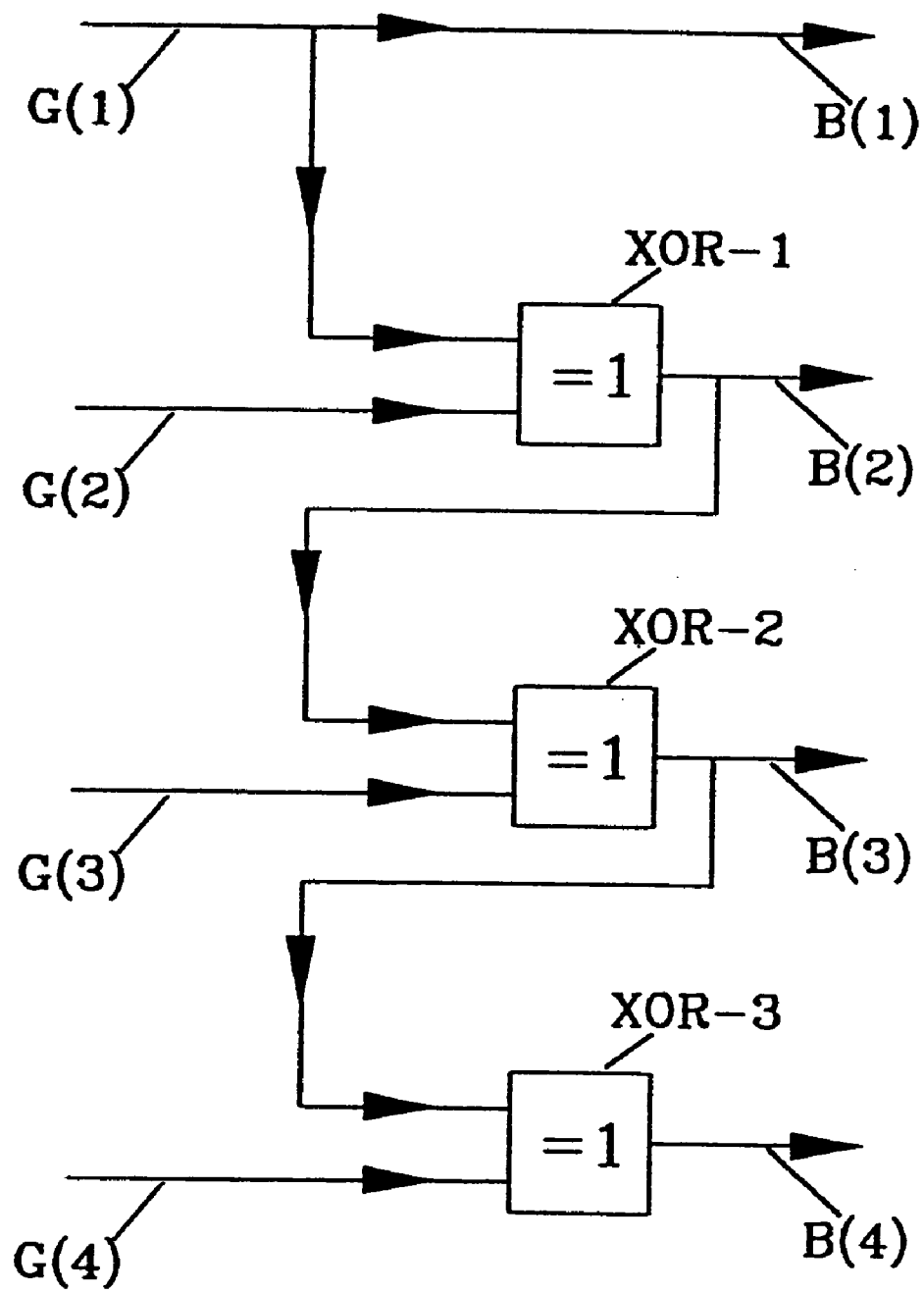
FIG. 6 is a schematic diagram illustrating the transformation of Gray coded bits into bits of regular binary code.

Naturally, the digital output signal of the Gray code pipeline A/D-converter according to the invention is in the form of Gray code. However, if the pipeline A/D-converter according to the invention is to be used in a system having equipment designed to work with normal or regular binary code, it may be more feasible to convert the Gray coded output signal into an output signal of regular binary code. Consequently, in this case, the inventive pipeline A/D-converter generating Gray coded signals, further incorporates, as a final stage, means for digitally transforming the Gray coded output signal into an output signal of regular binary code. FIG. 6 is a schematic diagram illustrating an illustrative transformation of 4 bits of Gray code into 4 bits of regular binary code by using simple digital gates XOR-1, XOR-2, XOR-3. The Gray code bits, here denoted G(i), are transformed into bits, here denoted B(i), of binary code according to the following known relations:

$$B(1)=G(1); \; B(i)=G(i) \oplus B(i-1), \; 2 \leq i \leq n \tag{4.1}$$

where n is the number of bits of the code values. In the example of FIG. 6, n is equal to 4. The Gray code MSB, G(1), transforms into the binary code MSB, B(1) without any change. The remaining Gray code bits are transformed into binary code bits by using the corresponding digital XOR-gates. This digital transformation does not introduce any offset errors. Accordingly, by using the inventive Gray code pipeline A/D-conversion in combination with the above digital Gray code-to-binary code transformation, it is possible to perform a pipeline A/D-conversion, of which the final output signal is in the form of regular binary code, and still maintain low accumulation of offset errors.

In order to facilitate the circuit realization of each stage in a Gray code pipeline converter according to the invention, equation (2.1) is rewritten in the following way:

$$V_o(i) = 2 \cdot (-1)^{b_i} \cdot V_{in}(i) + V_r = \{2 \cdot V_{in}(i) + (-1)^{b_i} \cdot V_r\} \cdot (-1)^{b_i} \tag{5.1}$$

By modifying the first Gray coding algorithm of equations (2.1) and (2.2) using the mathematical derivation of expression (5.1) the following second Gray coding algorithm results:

$$V_{in}(i=1) = V_{in}$$

$$V_o(i) = \{2 \cdot V_{in}(i) + (-1)^{b_i} \cdot V_r\} \cdot (-1)^{b_i} (1 \leq i \leq n-1); \; V_{in}(i+1) = V_o(i) \tag{5.2}$$

and $$b_i = \begin{cases} 1, & \text{if } V_{in}(i) \geq 0 \\ 0, & \text{if } V_{in}(i) < 0 \end{cases} \quad (1 \leq i \leq n) \tag{5.3}$$

This second Gray coding algorithm minimizes the number of operational amplifiers (OPAMPS) required in a circuit realization of a pipeline A/D-converter according to the invention. In a single stage, the number of required OPAMPS goes from 2 for a realization based on the first algorithm, to 1 for a realization based on the second algorithm. In a pipeline A/D-converter comprising a plurality of stages, the improvement is considerable. Consequently, by realizing a pipeline A/D-converter according to the second Gray coding algorithm given above, a low device count is obtained. Besides, the accumulation of systematic offset errors is very similar to that of a pipeline A/D-converter which is based on the first algorithm, as will be shown below.

Figure 7:
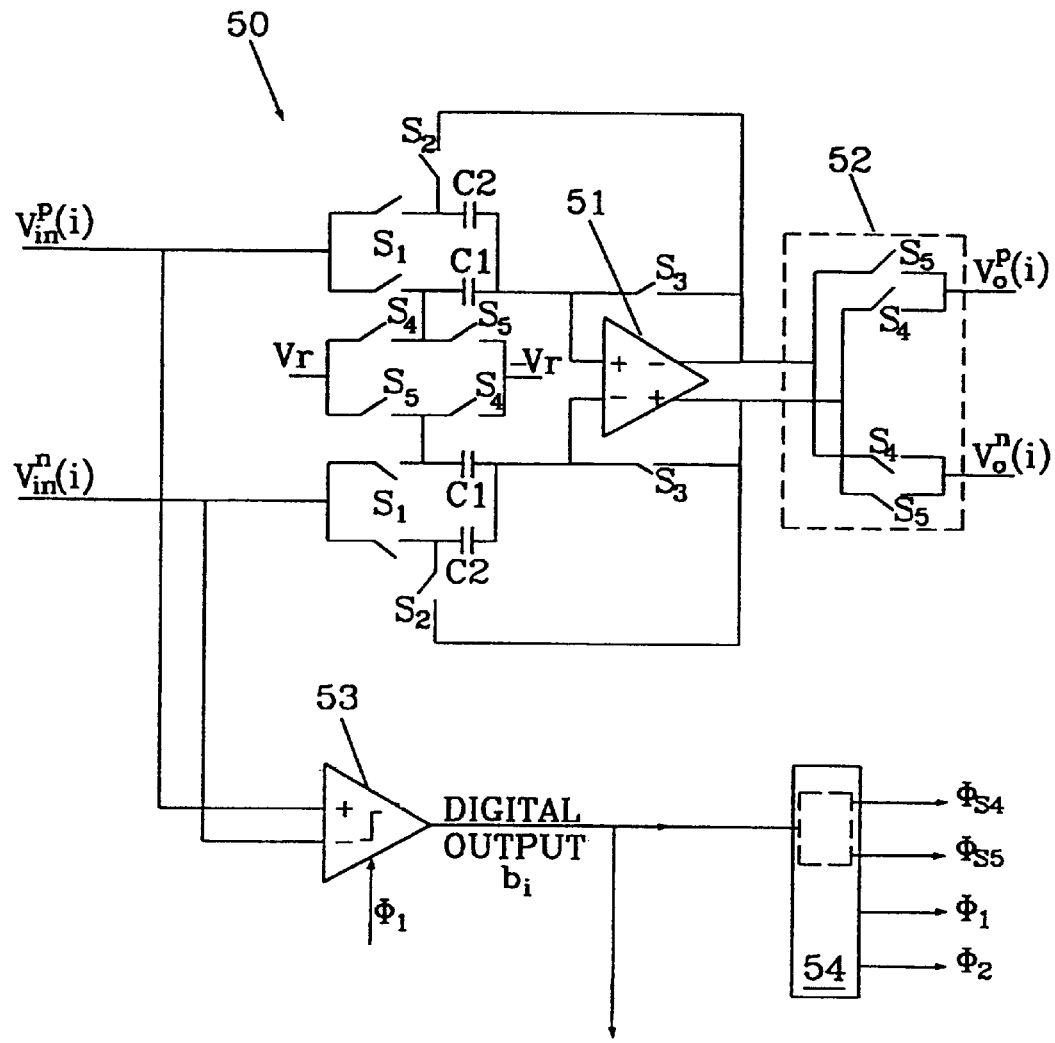
FIG. 7 is a circuit diagram of a fully differential realization of a single stage of a Gray code pipeline A/D-converter in accordance with a currently most preferred embodiment of the invention.

FIG. 7 is a circuit diagram of a fully differential switched-capacitor realization of a single stage of a pipeline A/D-converter in accordance with a preferred embodiment of the invention. The circuit realization is based on the second Gray coding algorithm given by equations (5.2) and (5.3). Assume that the i-th stage of a pipeline A/D-converter is considered. When dealing with differential A/D-converter realizations, a differential input signal to the stage is considered. The differential input signal has a positive part $V^p_{in}(i)$ and a negative part $V^n_{in}(i)$. They have the same magnitude but opposite polarity. In the same way, a predetermined differential reference signal, Vr and −Vr, is utilized by the A/D-converter stage. The pipeline A/D-converter stage 50 basically comprises capacitors C1, C2, an operational amplifier (OPAMP) 51, a switch arrangement 52, a comparator 53, a clock signal generator 54 and control switches $S_1$ to $S_5$.

Each one of the capacitors C1, C2 is connected to a respective switch $S_1$. The switches $S_1$ selectively connects the differential input of the stage 50 to the capacitors C1, C2. The capacitance of the capacitors C1 is equal to that of the capacitors C2. In addition, the capacitors C1 are selectively connected, via the switches $S_4$, $S_5$, to the differential reference signal. The switches $S_1$ and the capacitors C2 are referred to as input signal switch-capacitor units. The switches $S_1$, $S_4$, $S_5$ and the capacitors C1 are referred to as input/reference signal switch-capacitor units. The OPAMP 51 has two input terminals and two output terminals, and operates with an internal common mode feedback function. Each of the input terminals of the OPAMP 51 is connected to a pair of capacitors C1 and C2. Each one of the capacitors C2 is selectively connected, via switch $S_2$, in parallel over a respective pair of input-output terminals of the OPAMP 51. Furthermore, there is a switch $S_3$ connected in parallel over each pair of input-output terminals of the OPAMP 51. The switch arrangement 52 has two input terminals and two output terminals, and comprises four switches $S_4$, $S_5$. The comparator 53 has two input terminals and an output terminal. Preferably, the comparator 53 is a latched comparator. The clock signal generator 54 generates a first set of clock signals $\Phi_1$ and $\Phi_2$, of a predetermined and non-overlapping timing, and a second set of clock signals $\Phi_{S4}$ and $_{101}$ $_{S5}$ of a predetermined timing and with values that depend on the generated output bits. If the input to the stage is sampled at $\Phi_1$, the clock signals $\Phi_{S4}$ and $\Phi_{S5}$ are generated according to the following relations:

$$\Phi_{S4}=b_i \cdot \Phi_2$$

$$\Phi_{S5}=\overline{b_i} \cdot \Phi_2, \qquad (5.4)$$

where $\overline{b_i}$ represents the opposite logical state of $b_i$. If the input to the stage is sampled at $\Phi_2$, the clock signals $\Phi_{S4}$ and $\Phi_{S5}$ will be generated based on $\Phi_1$ instead of $\Phi_2$.

It should be understood that normally the clock signal generator 54 is common for the complete pipeline A/D-converter, each stage passing its generated output bit to the clock signal generator 54.

The differential input signal to the stage is passed to the switches $S_1$, and the capacitors C1, C2 associated thereto. In addition, the differential input signal to the stage is passed to the input terminals of the comparator 53. The output terminal of the comparator 53 is connected to the clock signal generator 54. The capacitors C1 are selectively connected, via switches $S_4$, $S_5$ associated thereto, to the reference signal source (Vr, -Vr). The output terminals of the OPAMP 51 are connected to the input terminals of the switch arrangement 52. The output terminals of the switch arrangement 52 normally constitutes the output terminals of the complete pipeline stage 50. Accordingly, the differential output signal of the switch arrangement 52 is the output of the stage.

Note that the output terminals of the switch arrangement 52 for a particular stage will be connected in series with the switches $S_1$ of the following stage. This series connection of switches may increase the signal path resistance. A way of avoiding this series connection of switches would be to remove the switches $S_1$ and instead duplicate the switch arrangement 52. In this case, there will be two parallel switch arrangements 52, one of which is directly connected to the capacitors C1 of the subsequent stage while the other one is directly connected to the capacitors C2 of the subsequent stage.

The selected topology illustrated in FIG. 7 has been chosen for simplicity of explanation.

Figure 8:
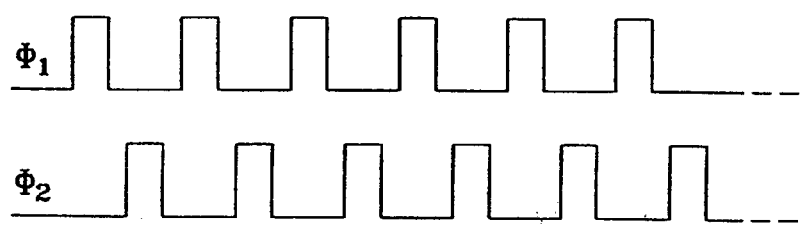
FIG. 8 is a timing diagram illustrating non-overlapping clock signals that are utilized in the operation of the fully differential realization of FIG. 7.

FIG. 8 is an example of a timing diagram illustrating the timing of the clock signals $\Phi_1$ and $\Phi_2$ utilized in the fully differential realization of FIG. 7. The operation of the converter stage 50 is controlled by these clock signals, and the clock signals $\Phi_{S4}$ and $\Phi_{S5}$ defined above. More specifically, $\Phi_1$ controls switches $S_1$ and $S_3$; $\Phi_2$ controls switches $S_2$; $\Phi_{S4}$ controls switches $S_4$; and $\Phi_{S5}$ controls switches $S_5$. Furthermore, $\Phi_1$ triggers the latched comparator 53. In this realization example, a switch is turned on when the corresponding clock signal goes high, and turned off when the clock signal goes low.

In short, the pipeline stage 50 operates as follows. In the first clock phase, when $\Phi_1$ is high, the differential input signal to the stage 50 is sampled by the capacitors C1, C2, and the comparator 53 generates the i-th MSB, $b_i$. The OPAMP 51 is reset; auto-zeroed. In the next clock phase, when $\Phi_2$ is high, the input signal to the stage 50 is amplified by a factor of 2, and the reference signal is added or subtracted depending on the i-th MSB generated by the comparator 53 in the previous clock phase. This is basically effected by the particular coupling of the OPAMP 51, the capacitors C1, C2 and the switches $S_1$, $S_2$ and the switches $S_4$, $S_5$ associated to the capacitors C1. Furthermore, the output signal of the OPAMP 51 is selectively inverted by the switch arrangement 52 in dependence on the generated output bit, thus generating the output of the stage 50.

The capacitors C1, C2 and the control switches $S_1$ associated thereto act as a sample-and-hold circuit of switched-capacitor type. Because of the hold operation of this sample-and-hold circuit, and the non-overlapping timing of the clock signals that control the comparator 53 and the switch arrangement 52, respectively, the bit decision of the comparator 53 and the selective inversion of the switch arrangement 52 are separated in time. This separation in time enables the feed-forward of the generated digital output to the switch arrangement 52.

It should be understood that the signal inversion executed in the switch arrangement 52 utilizes the digital information from the bit decision in the comparator 53, and decides whether or not the input to the switch arrangement 52 should be inverted based on this digital information. The signal inversion is preferably implemented as a digitally controlled polarity shift. In the fully differential realization 50 of FIG. 7 the inversion is performed by interchanging the polarity of the differential signal by using the digitally controlled switch arrangement 52. In this way, the signal inversion is realized with very high accuracy. The high precision of the signal inversion further improves the accuracy of the pipeline A/D-converter according to the invention.

Furthermore, it is important to understand that in this particular embodiment of the invention, the output bit generated by the comparator 53 is also utilized to decide whether or not the polarity of the differential reference signal should be shifted. This polarity shift is effected by the switches $S_4$, $S_5$ connected to the reference signal source (Vr, -Vr).

Figure 9A:
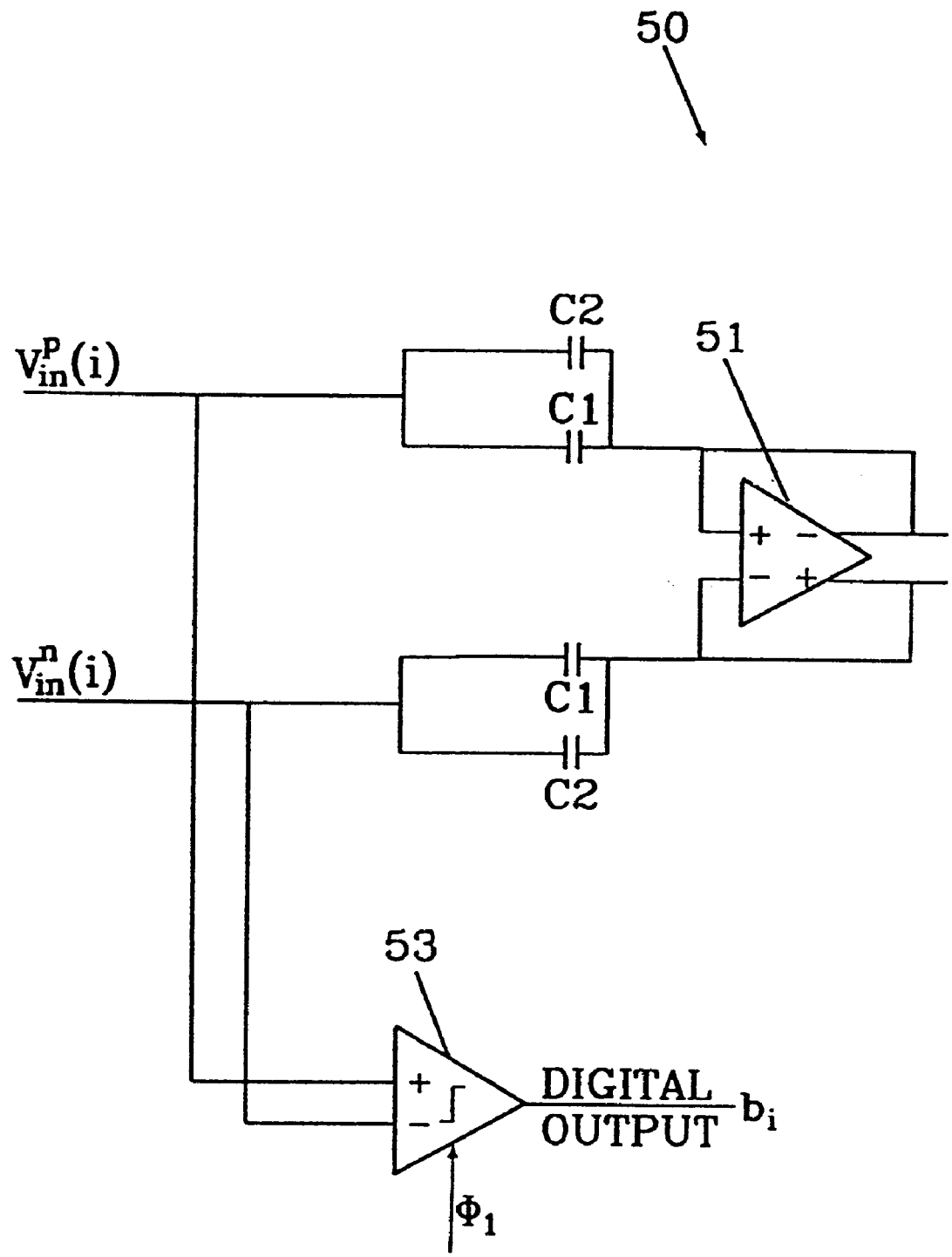
FIG. 9A–B are circuit diagrams of the fully differential realization of FIG. 7 at consecutive clock phases.
Figure 9B:
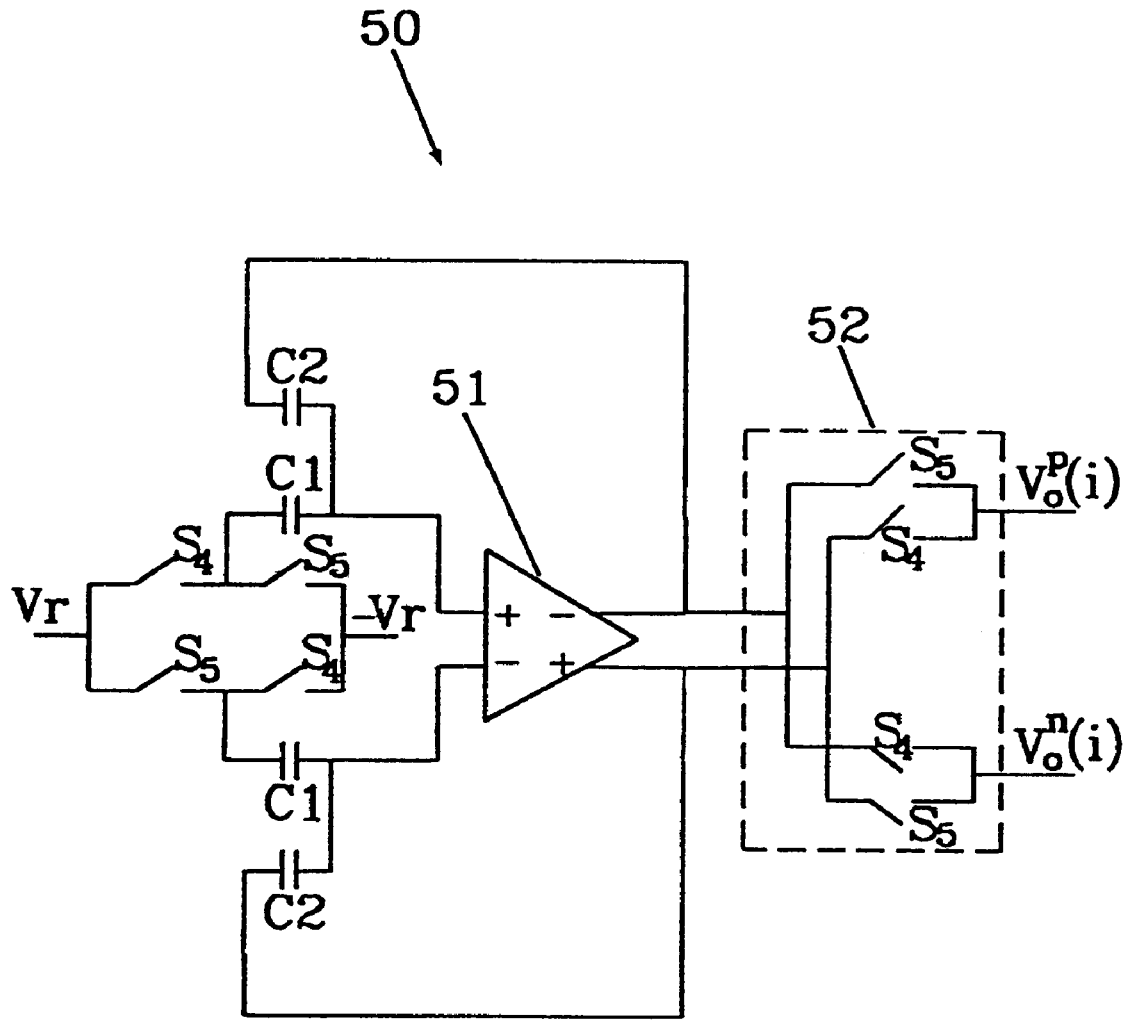

For a better understanding of the fully differential realization shown in FIG. 7, the operation of the pipeline A/D-converter stage 50 according to the invention will now be explained in more detail at the consecutive clock phases $\Phi_1$ and $\Phi_2$. FIGS. 9A–B are circuit diagrams of the fully differential realization of the pipeline A/D-converter at consecutive clock phases. The circuit diagrams have been reduced to illustrate only those parts of the pipeline stage 50 that are pertinent at the considered clock phase. Open switches and unconnected elements will generally not be illustrated.

FIG. 9A illustrates the pipeline stage 50 at the clock phase when $\Phi_1$ is high. The switches $S_1$ and $S_3$ are turned on. The differential input signal ($V^p_{in}(i)$, $V^n_{in}(i)$) of the i-th stage 50 is sampled by the input capacitors C1 and C2:

$$V^p_{in}(i)=V^p_o(i-1);\ V^p_{in}(1)=V^p_{in}$$
$$V^n_{in}(i)=V^n_o(i-1);\ V^n_{in}(1)=V^n_{in} \qquad (5.5)$$

where $V^p_o(i-1)$, $V^n_o(i-1)$ denotes the differential residue output signal of stage i-1, and $V^p_{in}$, $V^n_{in}$ denotes the differential input signal to the first stage of the pipeline A/D-converter.

The differential input signal of the i-th stage is also passed to the input terminals of the comparator 53, which generates the i-th MSB, $b_i$, according to the following relation:

$$b_i = \begin{cases} 1, & \text{if } V_{in}^p(i) - V_{in}^n(i) \geq 0 \\ 0, & \text{if } V_{in}^p(i) - V_{in}^n(i) < 0 \end{cases} \quad (5.6)$$

The input to the comparator 53 is differential and the output is digital. Furthermore, in the clock phase of $\Phi_1$, the OPAMP 51 is reset to enable suppression of the DC-offset of the OPAMP.

FIG. 9B illustrates the pipeline stage 50 during the clock phase when $\Phi_2$ is high. The switches $S_2$ are turned on. Accordingly, the capacitors $C2$ are connected in parallel over the OPAMP 51. The reference signal source $Vr$, $-Vr$ is switched into connection with the capacitors $C1$. The sign of the reference signal that is switched into connection with the respective capacitor $C1$ on each side of the differential structure will be either positive or negative, depending on the generated output bit $b_i$. This is expressed as $(-1)^{b_i} \cdot V_r$ in equation (5.2). The clock signals $\Phi_{S4}$ and $\Phi_{S5}$ that control the switches $S_4$ and $S_5$, connected to the capacitors $C1$, depend on the generated output bit. All the switches $S_4$ and $S_5$ are illustrated as open, although in reality, either the switches $S_4$ or the switches $S_5$ will be closed in this clock phase. Because of the coupling of the OPAMP 51 and the capacitors $C1$, $C2$, the differential input signal to the stage sampled onto the capacitors $C1$, $C2$ in the previous clock phase will come out amplified by a factor of 2 at the output terminals of the OPAMP 51. In addition, the reference signal will contribute to the output of the OPAMP 51; either as a negative term or as a positive term, depending on the output bit generated by the comparator 53 as explained above. Finally, the output signal of the OPAMP 51 is passed to the switch arrangement 52. The switch arrangement 52 performs a signal inversion, also in dependence on the output bit generated by the comparator 53 in the previous clock phase. More specifically, the states of the switches $S_4$ and $S_5$ controlled by the clock signals $\Phi_{S4}$ and $\Phi_{S5}$, respectively, determine whether or not the switch arrangement 52 interchanges the polarity of the differential signal. Accordingly, the output of the switch arrangement, and indeed, the output of the complete pipeline stage 50, will be given by:

$$V^p_o(i) = \{2 \cdot V^p_{in}(i) + (-1)^{b_i} \cdot V_r\} \cdot (-1)^{b_i}$$

$$V^n_o(i) = \{2 \cdot V^n_{in}(i) - (-1)^{b_i} \cdot V_r + \Delta V_e(i)\} \cdot (-1)^{b_i} \quad (5.7)$$

which is rewritten as:

$$V^p_o(i) = 2^i \cdot (-1)^{\sum_{j=1}^{i} b_j} \cdot V^p_{in} + \left\{\sum_{j=1}^{i-1}\left(2^{i-j} \cdot (-1)^{\sum_{k=j+1}^{i} b_k}\right) + 1\right\} \cdot V_r \quad (5.8)$$

$$V^n_o(i) = 2^i \cdot (-1)^{\sum_{j=1}^{i} b_j} \cdot V^n_{in} + \left\{\sum_{j=1}^{i-1}\left(2^{i-j} \cdot (-1)^{\sum_{k=j+1}^{i} b_k}\right) + 1\right\} \cdot V_r +$$

$$\sum_{j=1}^{i}\left(2^{i-j} \cdot (-1)^{\sum_{k=j+1}^{i} b_k} \cdot \Delta V_e(j)\right)$$

$\Delta V_e(i)$ represents an error voltage produced in the i-th stage. For simplicity it is assumed that the error $\Delta V_e(i)$ produced in the i-th stage is introduced at the OPAMP 51 on the negative side of the differential realization. This error voltage is representative of a number of different types of errors voltages. Switches provided at high impedance nodes normally inject a small charge, a so called clock induced charge, which gives rise to a DC-offset error voltage. In a differential realization, these offset errors will ideally exclude each other. However, asymmetric switch pairs in regard to clock induced charge injection will generate a DC-offset. In general, there is a DC-offset inherent in the OPAMP. However, in accordance with the invention, this offset is minimized by resetting the OPAMP and storing the offset in the capacitors associated with the OPAMP. In the following, all errors together, including low-frequency noise as well, in a stage, are represented by the error voltage $\Delta V_e(i)$. The error voltage $\Delta V_e(i)$ consists of two terms, $\Delta V_e$ and $\Delta V_r(i)$. The term $\Delta V_s$ represents a systematic offset error that is identical for all stages, whereas the term $\Delta V_r(i)$ represents a random error that is individual for each stage. It has been assumed that the random errors are zero, and therefore $\Delta V_e(i)$ is equal to the systematic error $\Delta V_s$. In the following $\Delta V_e(i)$ will be substituted by $\Delta V_s$.

To realize an n-bit pipeline A/D-converter, n stages are required. However, the last stage, i.e. the n-th stage, only has to include a comparator which compares the output signal of the (n−1)-th stage with a zero level to generate the n-th output bit, the LSB. Non-overlapping clock signals such as those shown in FIG. 8 are normally used to control the operation of the pipeline A/D-converter. If the input to the i-th stage is sampled on clock phase $\Phi_1$, the input to the (i+1)-th stage is sampled on clock phase $\Phi_2$. The i-th MSB precedes the (i−1)-th MSB by half a clock period.

The residue output signal of the (n−1)-th stage is given by:

$$V^p_o(n-1) = 2^{n-1} \cdot (-1)^{\sum_{j=1}^{n-1} b_j} \cdot V^p_{in} + \quad (5.9)$$

$$\left\{\sum_{j=1}^{n-2}\left(2^{n-1-j} \cdot (-1)^{\sum_{k=j+1}^{n-1} b_k}\right) + 1\right\} \cdot V_r$$

$$V^n_o(n-1) = 2^{n-1} \cdot (-1)^{\sum_{j=1}^{n-1} b_j} \cdot V^n_{in} -$$

$$\left\{\sum_{j=1}^{n-2}\left(2^{n-1-j} \cdot (-1)^{\sum_{k=j+1}^{n-1} b_k}\right) + 1\right\} \cdot V_r +$$

$$\sum_{j=1}^{n-1}\left(2^{n-1-j} \cdot (-1)^{\sum_{k=j}^{n-1} b_k} \cdot \Delta V_s\right).$$

The residue output signal of the (n−1)-th stage acts as input to the n-th stage:

$$V^p_{in}(n) = V^p_o(n-1)$$

$$V^n_{in}(n) = V^n_o(n-1) \quad (5.10)$$

where the n-th output bit $b_i$, the LSB is generated according to:

$$b_i = \begin{cases} 1, & \text{if } V_{in}^p(n) - V_{in}^n(n) \geq 0 \\ 0, & \text{if } V_{in}^p(n) - V_{in}^n(n) < 0 \end{cases} \quad (5.11)$$

The last term of $V^n_o(n-1)$ in expression (5.9) above represents the total accumulated error generated in an n-bit pipeline A/D-converter based on the second Gray coding algorithm according to the invention:

$$\varepsilon_{Gray} = \sum_{j=1}^{n-1} \left( 2^{n-1-j} \cdot (-1)^{\sum_{k=j}^{n-1} b_k} \cdot \Delta V_s \right) \quad (5.12)$$

The expression (5.12) is very similar to the expression (2.5) given above (under the condition that the random errors are assumed to be zero); the indexation differs slightly. It can be shown that the accumulated error given by (5.12) is less than the accumulated error for a binary code counter part.

It should be understood that single-ended A/D-converter realizations based on the fully differential realization described above are easily obtained.

In accordance with a currently most preferred embodiment of the invention, the switches $S_1$ are removed and instead the switch arrangement 52 is duplicated in parallel and the output terminals of the parallel switch arrangements 52 are connected directly to the capacitors C1 and C2 of the following stage.

Simulations

The operation of a conventional binary code pipeline A/D-converter and the Gray code pipeline A/D-converter proposed according to the invention have been simulated in an algorithm simulator. Both static and dynamic performances have been studied.

Figure 10:
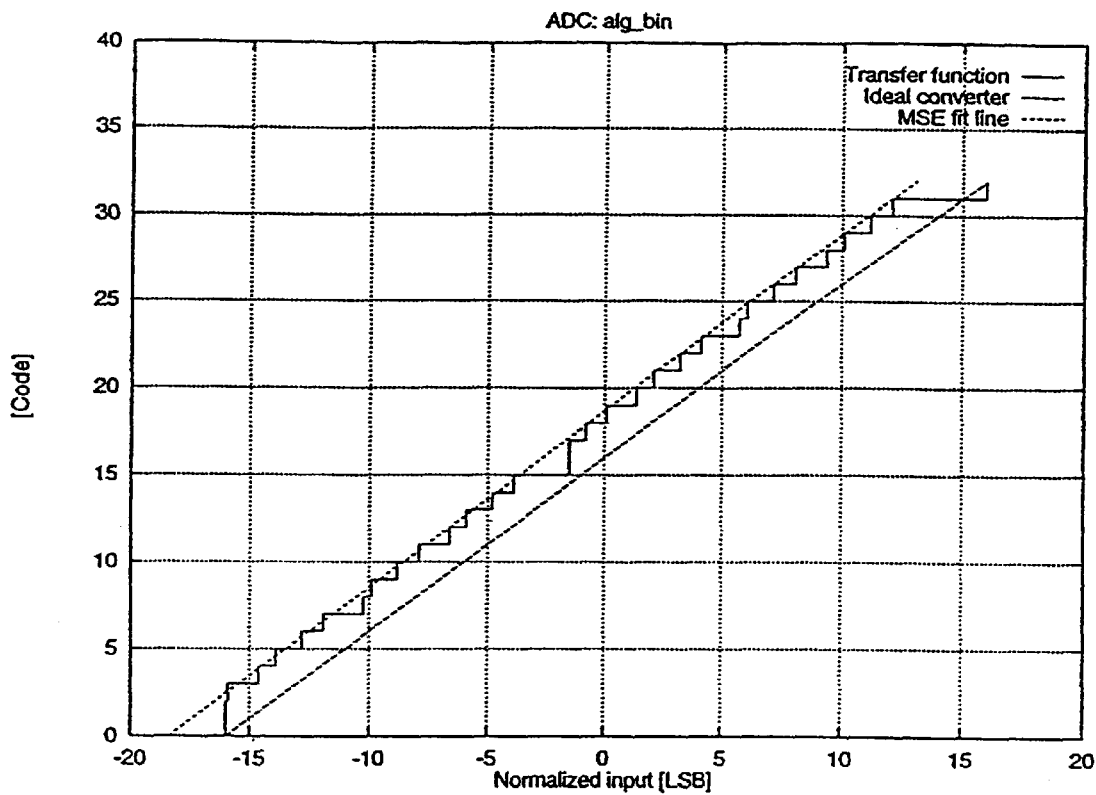
FIG. 10 illustrates a transfer curve of a 5-bit pipeline A/D-converter based on binary coding.
Figure 11:
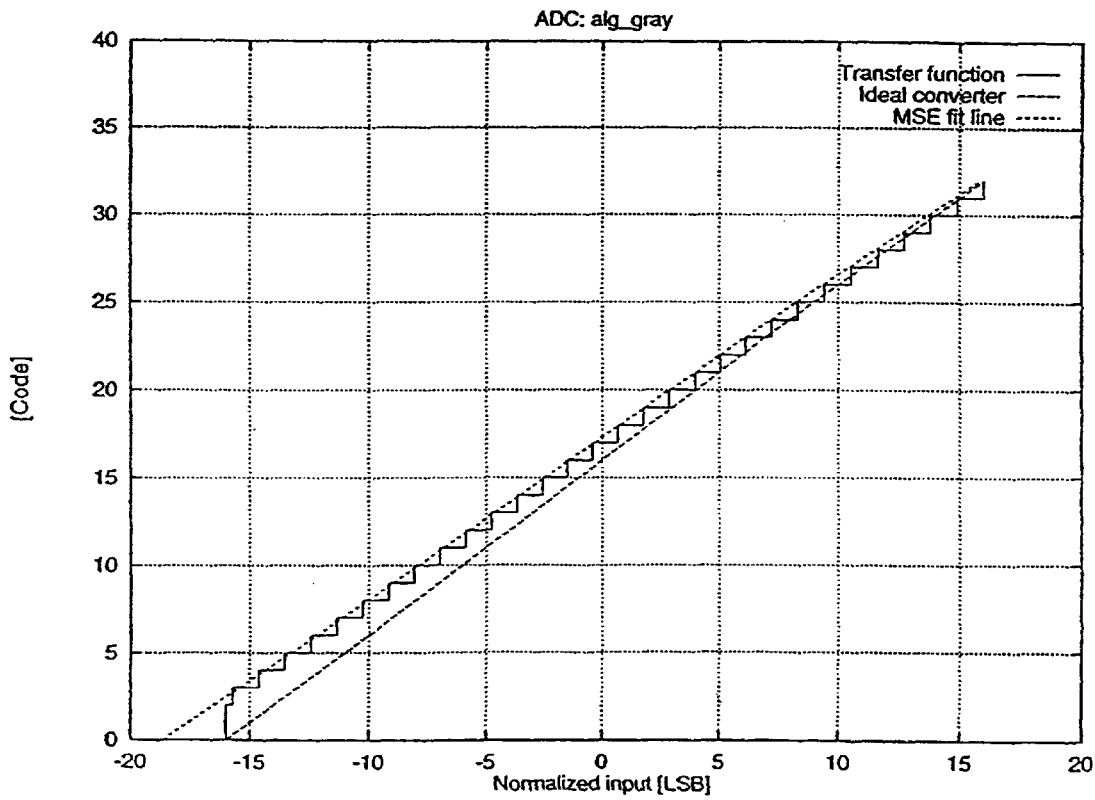
FIG. 11 illustrates a transfer curve of a 5-bit pipeline A/D-converter based on a Gray coding algorithm according to the invention.

Regarding the static behavior, the introduction of systematic offset errors has been simulated and the effects will be briefly described with reference to FIGS. 10 and 11. In FIG. 10 there is illustrated a transfer curve of a 5-bit pipeline A/D-converter based on binary coding. FIG. 11 illustrates a transfer curve of a 5-bit pipeline A/D-converter based on the first Gray coding algorithm according to the invention. In each case, the magnitude of introduced systematic offset errors is assumed to be 1.5 LSB.

It is seen from FIG. 10 that the simulated systematic offset errors gives the transfer curve for the binary code A/D-converter apparent non-linear characteristics. The transfer curve departs from the ideal stepped transfer curve, and missing codes, such as code 16, are introduced in the binary code pipeline A/D-converter.

In the transfer curve of FIG. 11 for the Gray code pipeline A/D-converter according to the invention, the only noticeable effect of the simulated systematic offset errors is the introduction of a small gain error. The slope or gain of the transfer curve has changed, but otherwise the ideal stepped form of the curve remains unchanged.

In addition, the proposed Gray code architecture of pipeline A/D-converters also turns out to improve the operation performance in comparison to conventional binary code pipeline A/D-converters in several other ways. The integral non-linearity and the differential non-linearity of the inventive Gray code A/D-converter are much smaller than their binary code counterparts. The signal-to-noise-and-distortion ratio (SNDR) and the spurious-free dynamic range (SFDR) are improved significantly by the proposed Gray code conversion.

In summary, both theoretical derivations and system simulations have shown that the proposed Gray code pipeline A/D-converters are superior to conventional pipeline A/D-converters. The new and inventive pipeline A/D-converter architectures based on the Gray coding algorithms according to the invention are well suited for high-accuracy as well as for low-distortion applications. In accordance with a second aspect of the invention, the inverse of the principles utilized for pipeline A/D-conversion is used for pipeline digital-to-analog (D/A) conversion. Accordingly, the second aspect of the invention relates to the conversion of digital input signals into analog output signals. In accordance with a preferred embodiment of the second aspect of the invention, a Gray coded digital signal is converted into an analog output signal according to an algorithm defined by the following equation:

$$V_g(i) = \frac{1}{2} \cdot [V_g(i+1) - V_r] \cdot (-1)^{b_g(i)}, i = N, N-1, \ldots, 1 \quad (6.1)$$

where $b_g(1)$ designates the MSB and $b_g(N)$ designates the LSB, assuming an N-bit D/A-converter. The subscript g indicates that the digital input is Gray code. $V_g(i)$ represents the intermediate analog quantity associated with the i-th LSB, where $2 \leq i \leq N$, and $V_g(N+1)=0$. The output quantity of the D/A-converter is $V_{gout}$ which is equal to $V_g(1)$. $V_r$ denotes a predetermined reference quantity. The D/A-conversion starts from the LSB. The intermediate quantities, the reference quantity and the output quantity can be charges, voltages or currents depending on the particular circuit realization.

By iterating equation (6.1) until i=1, the result will be:

$$V_{gout} = V_g(1) = -\left\{ \sum_{i=1}^{N} \frac{1}{2^i} (-1)^{\sum_{j=1}^{i} b_g(j)} \right\} \cdot V_r \quad (6.2)$$

Suppose there is an offset error $\Delta V_g(i)$ in generating each of the intermediate quantities and the output quantity. Referring to equation (6.1) above with consideration to the error $\Delta V_g(i)$, the following equation results:

$$V_g(i) = \frac{1}{2} \cdot [V_g(i+1) - V_r + \Delta V_g(i)] \cdot (-1)^{b_g(i)} \quad (6.3)$$

By iterating equation (6.3) until i=1, the result will be:

$$V_{gout} = V_g(1) = -\left\{ \sum_{i=1}^{N} \frac{1}{2^i} (-1)^{\sum_{j=1}^{i} b_g(j)} \right\} \cdot V_r + \left\{ \sum_{i=1}^{N} \frac{1}{2^i} (-1)^{\sum_{j=1}^{i} b_g(j)} \cdot \Delta V_g(i) \right\} \quad (6.4)$$

Therefore, the total accumulated error in a complete D/A-conversion according to the invention is determined by:

$$\Delta V_{gout} = \left\{ \sum_{i=1}^{N} \frac{1}{2^i} (-1)^{\sum_{j=1}^{i} b_g(j)} \cdot \Delta V_g(i) \right\} \quad (6.5)$$

The total accumulated error in a D/A-conversion according to the invention is considerably lower than that in conventional D/A-conversions. In particular, in comparison to binary code pipeline D/A-conversion, a corresponding improvement as that between pipeline A/D-conversion according to the invention and conventional binary code pipeline A/D-conversion is obtained.

Figure 12:
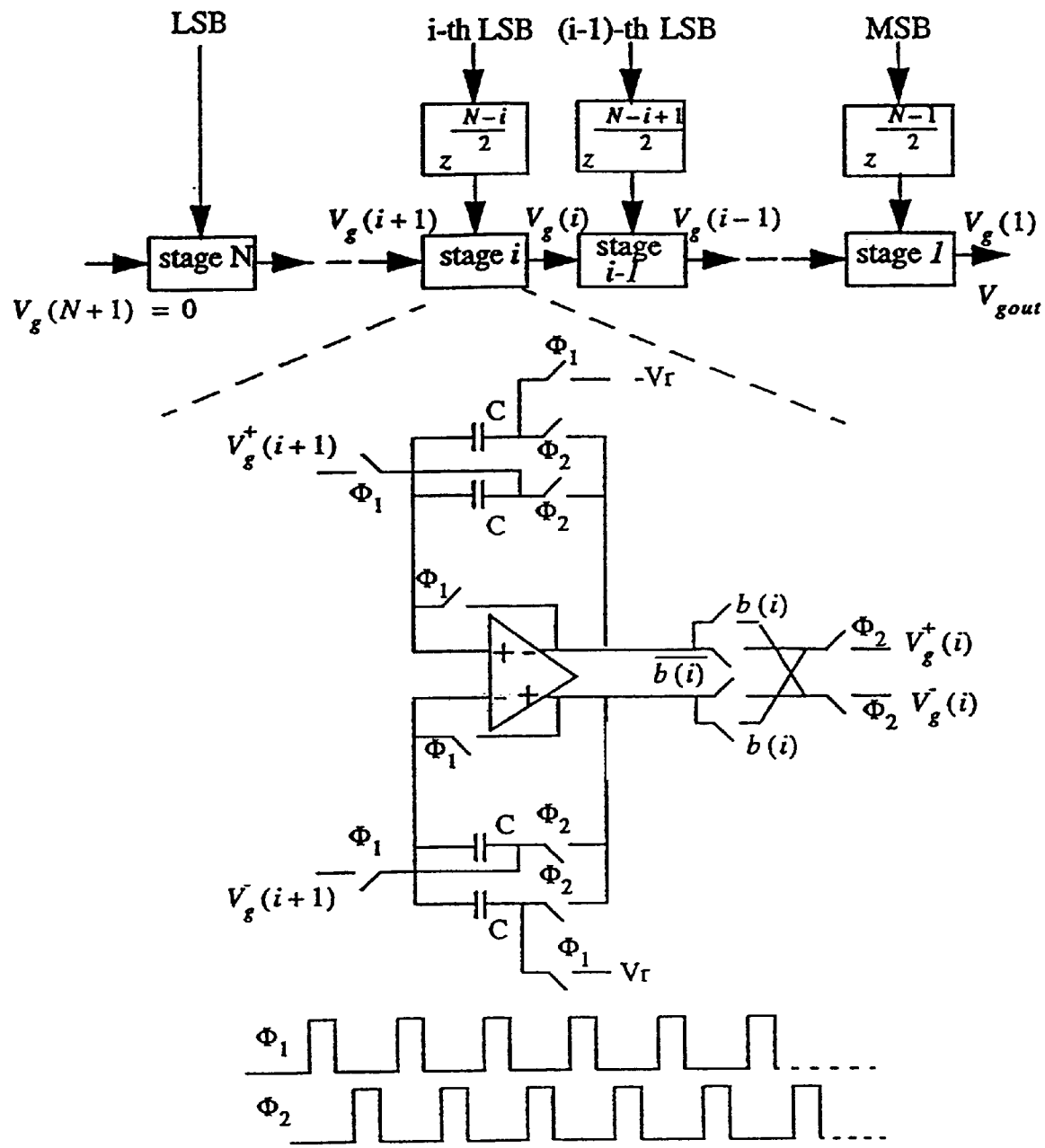
FIG. 12 is a circuit diagram of a fully differential realization of a single stage of a D/A-converter according to the invention.

FIG. 12 is a circuit diagram of a fully differential realization of a pipeline D/A-converter in accordance with the invention. The circuit implementation of FIG. 12 realizes the algorithm given by equation (6.1). Just as the fully differential A/D-converter realization of FIG. 7, the D/A-converter realization of FIG. 12 is of switched-capacitor type with digitally controlled switches. The non-overlapping clock signals $\Phi_1$ and $\Phi_2$ that control the operation of the pipeline D/A-converter are also illustrated in FIG. 12. The N-bit D/A-converter of FIG. 12 comprises N cascaded stages, of which only the i-th stage is illustrated in detail. The intermediate output $V_g(i)$ of stage i is the input to stage i−1. The input $V_g(N+1)$ to stage N is equal to zero. The output $V_g(1)$ of stage 1 is the final output $V_{gout}$ of the pipeline D/A-converter. In order to process the data properly, the successive bits of the Gray coded input signal are delayed by half a clock cycle starting from the LSB. The notation $$z^{\frac{N-i}{2}}$$

indicates the delay by $$\frac{N-i}{2}$$

clock cycles, where N>i>1. Since a D/A-conversion is the inverse of an A/D-conversion, reference is made to the description in connection with the A/D-converter of FIGS. 7, 8 and 9A–B for a more detailed understanding of the D/A-converter of FIG. 12. However, it should be understood that in each stage of the pipeline D/A-converter according to the invention, a subtraction of the reference and an amplification by a factor of 0.5 are performed. It should also be understood that the Gray code bits of the digital signal determine whether or not the inverse function is realized.

The embodiments described above are merely given as examples, and it should be understood that the invention is not limited thereto. It is of course possible to embody the invention in specific forms other than those described without departing from the spirit of the invention. Further modifications and improvements which retain the basic underlying principles disclosed and claimed herein are within the scope and spirit of the invention.

What is claimed is:

1. In a pipeline A/D-converter having a predetermined number, n, of stages connected in series, a method for converting an analog input signal $V_{in}$ into a digital output signal of n output bits $b_i$, where i is an integer ranging from 1 to n, said analog input signal $V_{in}$ being defined as a local input signal $V_{in}(i=1)$ to the first stage, said method comprising the steps of:

in the i-th stage, where i goes from 1 to n−1:
comparing the local input signal $V_{in}(i)$ to said i-th stage with a predetermined level to generate the i-th output bit $b_i$; and
subjecting said local input signal $V_{in}(i)$ to a sample and hold operation, to an amplification by two, selectively, depending on said generated i-th output bit, to a signal inversion, and to an addition of a predetermined reference signal such as to generate a next local input signal $V_{in}(i+1)$; and
in the n-th stage:
comparing said local input signal $V_{in}(n)$ to said n-th stage with a predetermined level to generate the n-th output bit $b_n$.

2. The method according to claim 1, further comprising the step of digitally converting said digital output signal into an output signal of regular binary code.

3. A pipeline A/D-converter for converting an analog input signal $V_{in}$ into a digital output signal of a predetermined number, n, of output bits $b_i$ by using a predetermined reference signal $V_r$, where i is an integer ranging from 1 to n, said pipeline A/D-converter comprising:

means for generating the output bits $b_i$ according to a Gray coding algorithm defined by the following equations:

$$V_{in}(i=1)=V_{in}$$

$$V_o(i)=\{2 \cdot V_{in}(i)+(-1)^{b_i} \cdot V_r\} \cdot (-1)^{b_i} \ (1 \leq i \leq n-1); \ V_{in}(i+1)=V_o(i)$$

and $$b_i = \begin{cases} 1, \text{ if } V_{in}(i) \geq 0 \\ 0, \text{ if } V_{in}(i) < 0 \end{cases} \ (1 \leq i \leq n).$$

4. A pipeline A/D-converter according to claim 3, wherein said pipeline A/D-converter is of switched-capacitor type.

5. A pipeline stage for a pipeline A/D-converter, wherein the pipeline stage is responsive to an analog input signal and a predetermined reference signal, the pipeline stage comprising:

a comparator for generating an output bit in response to the analog input signal;
a sample-and-hold circuit for sampling and holding the analog input signal;
an amplifying circuit for amplifying the sampled and held signal by a factor of 2;
means for selectively, in dependence on the generated output bit, adding and subtracting the predetermined reference signal to the output signal of the amplifying circuit; and
means for selectively, in dependence on the generated output bit, inverting the output signal of the amplifying circuit,
wherein the comparator, the sample-and-hold-circuit, the amplifying circuit, the means for selectively adding and subtracting, and the means for selectively inverting are controlled by clock signals generated by a clock signal generator.

6. A pipeline A/D-converter stage according to claim 5, further comprising means for resetting said amplifying circuit.

7. A pipeline stage for a pipeline analog-to-digital (A/D) converter, wherein the pipeline stage is responsive to a differential analog input signal and a predetermined differential reference signal, the pipeline stage comprising:

a comparator for generating an output bit in response to the differential input signal;
switch-capacitor units responsive to the differential input signal and the predetermined differential reference signal, and having first capacitors and second capacitors, first control switches for selectively connecting the differential input signal to the first and second capacitors, and second control switches for selectively, depending on the generated output bit, shifting the polarity of the differential reference signal and for selectively connecting the selectively polarity shifted differential reference signal to the first capacitors, the first and second capacitors being charged in response to the differential input signal and the selectively polarity shifted differential reference signal;

an operational amplifier having two input terminals and two output terminals, each one of the input terminals being connected to a respective one of the switch-capacitor units with each one of the second capacitors of the switch-capacitor units selectively connected in parallel over a respective pair of input-output terminals of the operational amplifier; and a switch arrangement connected to the output terminals of the operational amplifier for selectively, depending on the output bit, interchanging the polarity of the output signal of the operational amplifier, wherein the comparator, the first and second control switches, and the switch arrangement are controlled by clock signals generated by a clock signal generator.

8. A pipeline A/D-converter stage according to claim 7, further comprising means for resetting said operational amplifier.

9. A method for pipeline A/D-conversion of an analog input signal $V_{in}$ into a digital output signal of a predetermined number, n, of output bits $b_i$ by using a predetermined reference signal $V_r$, where i is an integer ranging from 1 to n, said method comprising the step of:

generating the output bits according to a Gray coding algorithm defined by the following equations:

$$V_{in}(i=1)=V_{in}$$

$$V_o(i)=\{2\cdot V_{in}(i)+(-1)^{b_i}\cdot V_r\}\cdot(-1)^{b_i} \; (1\leq i \leq n-1); \; V_{in}(i+1)=V_o(i)$$

and $$b_i = \begin{cases} 1, \text{ if } V_{in}(i) \geq 0 \\ 0, \text{ if } V_{in}(i) < 0 \end{cases} \; (1 \leq i \leq n).$$

10. A pipeline A/D-converter for converting an analog input signal into a digital output signal by using a predetermined reference signal, said pipeline A/D-converter having a number of stages connected in cascade such that the output of each stage is connected to the input of the next successive stage, the input of the first of said stages being responsive to the analog input signal, each one of said stages comprising:

a comparator for generating an output bit in response to the signal applied to the input of said stage; and means for subjecting said signal applied to the input of said stage to a sample and hold operation, to an amplification by two, selectively, depending on said generated output bit, to a signal inversion, and to an addition of said predetermined reference signal such as to generate an output signal of said stage.

11. A pipeline stage for a pipeline A/D-converter, said pipeline stage having an analog input terminal, an analog output terminal and a digital output terminal, the analog input terminal being responsive to an analog signal, said pipeline stage comprising:

a comparator for generating an output bit in response to said analog signal, and for applying said output bit to said digital output terminal;

means for subjecting said analog signal to a sample and hold operation, to an amplification by two, selectively, depending on said generated output bit, to a signal inversion, and to an addition of a predetermined reference signal such as to generate an analog output signal of said stage; and means for applying said analog output signal to said analog output terminal.

* * * * *